(12) United States Patent
Mizuta et al.

(10) Patent No.: US 10,217,652 B2
(45) Date of Patent: Feb. 26, 2019

(54) HEAT TREATMENT APPARATUS, HEAT TREATMENT METHOD, AND STORAGE MEDIUM

(71) Applicant: Tokyo Electron Limited, Tokyo (JP)

(72) Inventors: Masato Mizuta, Kumamoto (JP);
Tatsuya Kawaji, Kumamoto (JP);
Keigo Nakano, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 330 days.

(21) Appl. No.: 14/957,985

(22) Filed: Dec. 3, 2015

(65) Prior Publication Data
US 2016/0172218 A1 Jun. 16, 2016

(30) Foreign Application Priority Data

Dec. 10, 2014 (JP) ................................. 2014-250095
Sep. 17, 2015 (JP) ................................. 2015-184257

(51) Int. Cl.
| | |
|---|---|
| *H01L 21/67* | (2006.01) |
| *F27D 7/04* | (2006.01) |
| *F27B 3/02* | (2006.01) |
| *F27D 3/00* | (2006.01) |
| *H01L 21/02* | (2006.01) |

(52) U.S. Cl.
CPC .......... *H01L 21/67109* (2013.01); *F27B 3/02* (2013.01); *F27D 3/0084* (2013.01); *F27D 7/04* (2013.01); *H01L 21/6719* (2013.01); *H01L 21/67103* (2013.01); *H01L 21/02115* (2013.01); *H01L 21/02282* (2013.01); *H01L 21/02318* (2013.01)

(58) Field of Classification Search
USPC ............................................................ 432/1
See application file for complete search history.

(56) References Cited

U.S. PATENT DOCUMENTS 6,090,183 A * 7/2000 Awaji ..................... B01D 53/64
55/320
6,143,080 A * 11/2000 Bartholomew ..... C23C 16/4412
118/715

(Continued)

FOREIGN PATENT DOCUMENTS

JP 2000-124206 A 4/2000

*Primary Examiner* — Steven B McAllister
*Assistant Examiner* — John Bargero
(74) *Attorney, Agent, or Firm* — Abelman, Frayne & Schwab

(57) ABSTRACT

Disclosed is a heat treatment apparatus for performing a heat treatment on a coating film formed on a substrate. The apparatus includes a placing unit provided within a processing container, and configured to place the substrate thereon; a heating unit configured to heat the substrate placed on the placing unit; a gas supply port provided along a circumferential direction outside the substrate on the placing unit in a plan view, and configured to supply gas into the processing container; an outer circumferential exhaust port provided along the circumferential direction outside the substrate on the placing unit in a plan view, and configured to exhaust an inside of the processing container; and a central exhaust port provided above a central portion of the substrate on the placing unit, and configured to exhaust the inside of the processing container.

18 Claims, 23 Drawing Sheets

(56) References Cited

U.S. PATENT DOCUMENTS

| | | | | |
|---|---|---|---|---|
| 6,354,832 B1* | 3/2002 | Yoshimura | ........ | H01L 21/67109 118/725 |
| 2007/0169373 A1* | 7/2007 | Aoki | ................. | H01L 21/67109 34/549 |
| 2008/0099181 A1* | 5/2008 | Ramanan | .......... | H01L 21/67109 165/61 |
| 2013/0108975 A1* | 5/2013 | Kang | ................ | H01L 21/67017 432/65 |

* cited by examiner

HEAT TREATMENT APPARATUS, HEAT TREATMENT METHOD, AND STORAGE MEDIUM

CROSS-REFERENCE TO RELATED APPLICATIONS

This application is based on and claims priority from Japanese Patent Application Nos. 2014-250095 and 2015-184257, filed on Dec. 10, 2014 and Sep. 17, 2015, respectively, with the Japan Patent Office, the disclosures of which are incorporated herein in their entireties by reference.

TECHNICAL FIELD

The present disclosure relates to a heat treatment apparatus, a heat treatment method, and a storage medium in which a substrate coated with a coating liquid is placed in a processing container and the substrate is heated while evacuating the container.

BACKGROUND

In a semiconductor manufacturing process, since resist patterns easily collapse with miniaturization of circuit patterns, various measures have been considered. As one of the measures, a technique has been conducted, in which a resist pattern is transferred to an underlayer film formed on a semiconductor wafer (hereinafter, referred to as a "wafer"), and the pattern of the underlayer film is used as an etching mask to perform an etching of the wafer. For the underlayer film, high plasma resistance and high etching resistance are required. For example, a spin-on-carbon (SOC) film, which is formed by spin coating, has been used as the underlayer film.

The wafer coated with the SOC film is heated after a coating processing, so that a solvent remaining in the coating film is dried or a crosslinking reaction by a crosslinking agent is facilitated. At this time, a sublimate is generated from the coating film. As a heat treatment apparatus for performing such a heat treatment, for example, Japanese Patent Laid-Open Publication No. 2000-124206 discloses an apparatus in which a periphery of a hot plate that heats a substrate is blocked by a ring shutter, an inert gas is introduced into a processing space from a periphery of the ring shutter, and an heat treatment is performed while exhausting the inert gas from an upper side of a central portion of the wafer.

Recently, it has been requested that the carbon content in the SOC film be increased in order to enhance the plasma resistance of the SOC film. As a measure for increasing the carbon content, heating is performed at a temperature (350° C. to 400° C.) higher than the conventional heating temperature (300° C.). However, in a case where the heating temperature is increased, since a low molecular weight polymer is also scattered in addition to the sublimate that sublimates from the crosslinking agent contained in the SOC film, the amount of the sublimate increases. Thus, it is necessary to increase an exhaust amount in order to suppress the sublimate from leaking out from the processing container to the outside. In that case, however, an air flow reaching the central portion on the wafer surface may be increased, and the coating film may be swollen. Therefore, an in-plane uniformity of the film thickness may be deteriorated.

SUMMARY

According to an aspect, the present disclosure provides a heat treatment apparatus for performing a heat treatment on a coating film formed on a substrate. The apparatus includes a placing unit provided within a processing container, and configured to place the substrate thereon; a heating unit configured to heat the substrate placed on the placing unit; a gas supply port provided along a circumferential direction outside the substrate on the placing unit in a plan view, and configured to supply gas into the processing container; an outer circumferential exhaust port provided along the circumferential direction outside the substrate on the placing unit in a plan view, and configured to exhaust an inside of the processing container; and a central exhaust port provided above a central portion of the substrate on the placing unit, and configured to exhaust the inside of the processing container.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
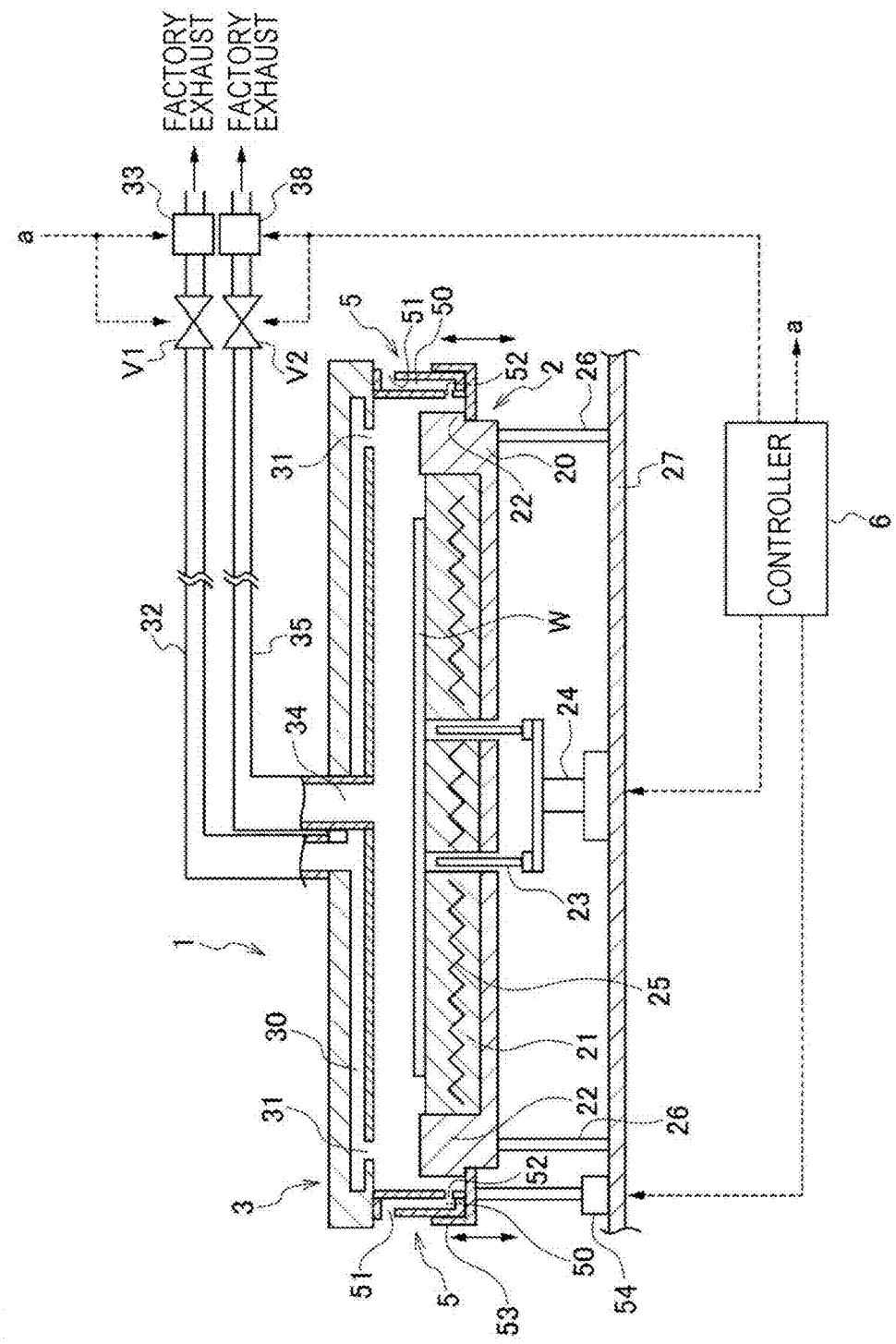
FIG. 1 is a vertical sectional side view illustrating a heat treatment apparatus related to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

An object of the present disclosure is to provide a technique in which, in performing a heat treatment on a coating film formed on a substrate, a sublimate is suppressed from leaking out to the outside of the processing container and a good in-plane uniformity with respect to a film thickness of the coating film is obtained.

Accordingly, the present disclosure provides a heat treatment apparatus for performing a heat treatment on a coating film formed on a substrate. The apparatus includes a placing unit provided within a processing container, and configured to place the substrate thereon; a heating unit configured to heat the substrate placed on the placing unit; a gas supply port provided along a circumferential direction outside the substrate on the placing unit in a plan view, and configured to supply gas into the processing container; an outer circumferential exhaust port provided along the circumferential direction outside the substrate on the placing unit in a plan view, and configured to exhaust an inside of the processing container; and a central exhaust port provided above a central portion of the substrate on the placing unit, and configured to exhaust the inside of the processing container.

In the above-mentioned heat treatment apparatus, one of the gas supply port and the outer circumferential exhaust port is opened at a position higher than the substrate, while the other one is opened at a position lower than the substrate. An air flow curtain is formed to surround the substrate by an air flow flowing from the gas supply port to the outer circumferential exhaust port.

In the above-mentioned heat treatment apparatus, the gas supply port includes a portion opened at a position lower than the substrate. The outer circumferential exhaust port includes a portion opened at a position higher than the substrate.

The above-mentioned heat treatment apparatus further includes a shutter member configured to open/close a carry-in/out port that carries the substrate into/from the processing container. The air flow curtain is formed closer to the substrate side than the shutter member.

In the above-mentioned heat treatment apparatus, the exhaust is performed at least from the outer circumferential exhaust port until a setting time point when a setting time has elapsed from a heating start time of the substrate or a setting time point when a temperature of the substrate exceeds a setting temperature, and the exhaust is performed at least from the central exhaust port after the setting time point.

In the above-mentioned heat treatment apparatus, the exhaust is performed by the outer circumferential exhaust port and the central exhaust port at the same time at least from the heating start time of the substrate to the setting time point.

In the above-mentioned heat treatment apparatus, the exhaust is performed by the outer circumferential exhaust port and the central exhaust port at the same time at least after the setting time point.

In the above-mentioned heat treatment apparatus, an exhaust amount of the central exhaust port is larger than an exhaust amount of the outer circumferential exhaust port at least after the setting time point.

In the above-mentioned heat treatment apparatus, at least one of the exhaust of the outer circumferential exhaust port and the exhaust of the central exhaust port is performed such that the exhaust amount increases or decreases with the lapse of time.

In the above-mentioned heat treatment apparatus, a cross-linking agent is contained in the coating film. The setting time point is a time point when a crosslinking reaction by the crosslinking agent is completed.

The above-mentioned heat treatment apparatus further includes an ejector connected to the central exhaust port through an exhaust path such that an exhaust flow is attracted by flow of a suction gas; and a supply/stop mechanism configured to perform supply of the suction gas to the ejector or stop of the supply.

The above-mentioned heat treatment apparatus further includes a mechanism for heating the suction gas.

In the above-mentioned heat treatment apparatus, a discharge side of the ejector is connected to a downstream side exhaust path where exhaust is performed by an exhausting power usage. A dummy ejector is provided such that its discharge side is connected to the downstream side exhaust path, and is configured to attract an atmosphere outside a flow path of the exhaust flow by the flow of the suction gas. When the supply of the suction gas is stopped by the supply/stop mechanism, the suction gas flows to the dummy ejector.

In the above-mentioned heat treatment apparatus, a pressure loss portion is provided between the central exhaust port and the ejector that attracts the exhaust flow, to suppress the exhaust from the central exhaust port when the supply of the suction gas is stopped in order to stop the attraction of the exhaust flow.

Further, the present disclosure provides a heat treatment method of performing a heat treatment on a coating film formed on a substrate. The method includes placing the substrate on a placing unit provided in a processing container, and heating the substrate; exhausting an inside of the processing container at least from an outer circumferential exhaust port provided along a circumferential direction outside the substrate on the placing unit in a plan view, while introducing gas from a gas supply port provided along the circumferential direction outside the substrate on the placing unit in a plan view, into the processing container, until a setting time point when a setting time has elapsed from a heating start time of the substrate or a setting time point when a temperature of the substrate exceeds a setting temperature; and exhausting the inside of the processing container at least from a central exhaust port provided above a central portion of the substrate on the placing unit, while introducing gas from the gas supply port into the processing container after the setting time point.

In the above-mentioned heat treatment method, an air flow curtain directed from one of a position higher than the substrate and a position lower than the substrate toward the other one is formed to surround the substrate by the exhaust of the outer circumferential exhaust port.

In the above-mentioned heat treatment method, the exhaust is performed by the outer circumferential exhaust port and the central exhaust port at the same time at least from the heating start time of the substrate to the setting time point.

In the above-mentioned heat treatment method, the exhaust is performed by the outer circumferential exhaust port and the central exhaust port at the same time at least after the setting time point.

Further, the present disclosure provides a non-transitory computer-readable storage medium stored with a computer program for use in an apparatus in which a substrate including a coating film formed thereon is placed on a placing unit in a processing container and the coating film is subjected to a heat treatment. The computer program includes a step group organized to, when executed, cause a computer to execute the above-described heat treatment method.

According to the present disclosure, in performing the heat treatment on the coating film formed on the substrate that is placed on the placing unit in the processing container, the outer circumferential exhaust port provided along the circumferential direction outside the substrate on the placing unit, and the central exhaust port provided above the central portion of the substrate on the placing unit and configured to exhaust the inside of the processing container, are used. Therefore, while the coating film has high fluidity, it is possible to depend on at least the exhaust by the outer circumferential exhaust port, and while the generation of the sublimate is increased, it is possible to depend on at least the exhaust by the central exhaust port. Accordingly, with a small exhaust amount, the sublimate may be suppressed from leaking out to the outside of the processing container. Further, good in-plane uniformity with respect to the film thickness may be obtained.

A heat treatment apparatus related to an exemplary embodiment of the present disclosure includes a processing container 1 as illustrated in FIG. 1. The processing container 1 includes a bottom structure 2 constituting a bottom portion, a top plate 3 serving as a ceiling, and a ring shutter 5 serving as a lateral surface. Although not illustrated, the processing container 1 is disposed in a housing that is an exterior body of a module forming a $N_2$ (nitrogen) gas atmosphere of positive pressure.

The bottom structure 2 is supported on a base 27 corresponding to the bottom surface of the housing (not illustrated) through a support member 26. The bottom structure 2 includes a support base 20 formed of a flat cylinder including a recess in a central side from an edge portion 22. A placing table 21, which is a placing unit configured to place a wafer W thereon, is fitted to the recess of the support base 20. The outer diameter of the support base 20 is set to, for example, 350 mm, and the outer diameter of the placing table 21 is set to, for example, 320 mm. The placing table 21 is provided with a heater 25 formed of a resistance heating element, which constitutes a heating unit configured to perform a heat treatment on the wafer W. Accordingly, the placing table 21 may also be referred to as a heating plate. In the following description, the placing table 21 will be referred to as the heating plate 21. Further, for example, three support pins 23 penetrate the bottom structure 2 and are provided circumferentially at equal intervals to perform exchange of a wafer W having a diameter of, for example, 300 mm with an external conveyance arm (not illustrated). The support pins 23 are moved up and down by an elevation mechanism 24 provided on the base 27 to project from or retract to the surface of the bottom structure 2.

The top plate 3 is constituted with a disc-shaped member having a diameter larger than that of the bottom structure 2. The top plate 3 is supported by a ceiling of the housing (not illustrated), faces an upper surface of the bottom structure 2 across a gap, and is provided such that its outer edge is positioned outside an outer edge of the bottom structure 2 in a plan view. A flat cylindrical exhaust chamber 30 is formed inside the top plate 3. The exhaust chamber 30 is formed such that its outer edge is positioned at substantially the same position as that of the outer edge of the bottom structure 2. On the bottom surface of the exhaust chamber 30, for example, about 100 outer circumferential exhaust ports 31 are opened circumferentially at equal intervals along the edge portion. Therefore, the outer circumferential exhaust ports 31 are opened at positions outside the outer edge of the wafer W placed on the bottom structure 2. Further, an exhaust pipe (hereinafter, referred to as an "outer circumferential exhaust pipe") 32 is connected to an upper side of the exhaust chamber 30. Assuming that the top plate 3 side is the upstream side, the outer circumferential exhaust pipe 32 is connected to a factory exhaust path provided in a factory with a valve V1 and a flow rate adjusting unit 33 being interposed from the upstream side.

Further, in the central portion at the bottom side of the top plate 3, a central exhaust port 34 is opened such that its center coincides with the center of the wafer W placed on the bottom structure 2. The central exhaust port 34 is connected with one end of a central exhaust pipe 35 which is provided to penetrate the top plate 3 and the exhaust chamber 30. Assuming that the top plate 3 side is the upstream side, the central exhaust pipe 35 is connected to the factory exhaust path with a valve V2 and a flow rate adjusting unit 38 being interposed from the upstream side.

Further, around the bottom structure 2, the ring shutter 5, which is a shutter member that blocks a gap between the bottom structure 2 and the top plate 3 to form a processing space, is provided. The ring shutter 5 is provided with a ring-shaped portion 50 in which a hollow strip member is formed in an annular shape.

At a position near an upper side of the outer circumferential surface of the ring-shaped portion 50, suction ports 51, each of which sucks external nitrogen gas into an internal space (gas supply chamber) of the ring-shaped portion 50, are formed at equal intervals over the whole circumference. At a position near a lower side of the inner circumferential surface of the ring-shaped portion 50, gas supply ports 52, each of which supplies internal nitrogen gas in the ring-shaped portion 50 into the processing container, are formed at equal intervals over the whole circumference. An annular ring-shaped plate 53 is provided on a lower surface of the ring-shaped portion 50. The ring-shaped plate 53 and the ring-shaped portion 50 are configured to be integrally moved up and down by the elevation mechanism 54.

Figure 2:
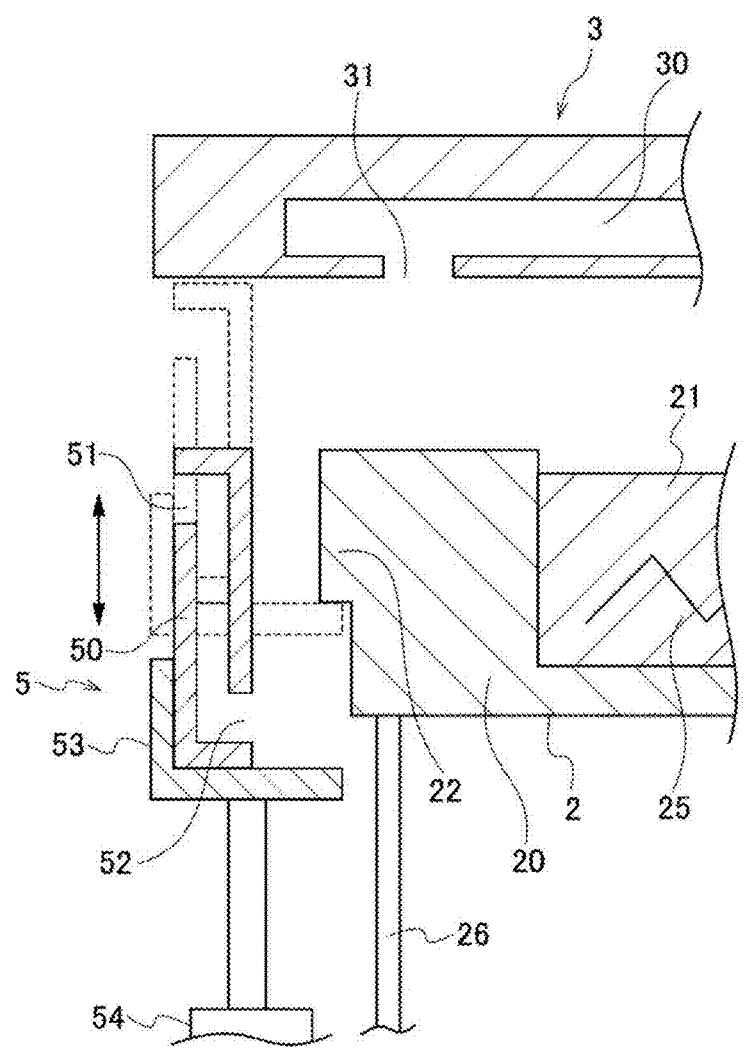
FIG. 2 is a vertical sectional side view illustrating opening/closing of a ring shutter.

As illustrated in FIG. 2, the ring shutter 5 is arranged such that the inner circumferential surface of the ring-shaped portion 50 faces the edge portion 22 of the bottom structure 2 across the gap. When the ring shutter 5 is moved up, as indicated by broken lines in FIG. 2, the upper surface of the ring shutter 5 is brought into contact with a lower surface of a peripheral portion of the top plate 3, and an upper surface side of an inner peripheral portion of the ring-shaped plate 53 is brought into contact with a step portion of the edge portion 22 of the bottom structure 2. Therefore, a processing space defined by the bottom structure 2, the top plate 3, the ring shutter 5, and the ring-shaped plate 53, is formed. In this case, the gas supply ports 52 are formed at a position lower than the height of the wafer W on the bottom structure 2. Further, when the ring shutter 5 is moved down to a position as indicated by solid lines in FIG. 2, the periphery of the processing space is opened over the whole circumference so that the carry-in/out of the wafer W is performed. Therefore, the gap between the bottom structure 2 and the top plate 3, which is opened by moving down the ring shutter 5, corresponds to a carry-in/out port of the wafer W.

Further, a heater (not illustrated) is embedded in the top plate 3 and a wall of the processing container 1 in order to suppress any sublimate from being precipitated inside the wall surface and the top plate 3, and is heated to, for example, 300° C.

Referring back to 1, the heat treatment apparatus includes a controller 6 constituted with a computer. The controller 6 includes a program storage unit. The program storage unit stores a program in which instructions about placement of the wafer by elevation of the support pins 23, elevation of the ring shutter 5, heating of the heater 25, flow rate adjustment of the flow rate adjusting units 33, 38 by opening/closing of the valves V1, V2, are organized. The program is stored in a storage medium such as, for example, a flexible disc, a compact disc, a hard disc, a magneto-optical (MO) disc, or a memory card, and is installed to the controller 6.

Subsequently, an action of the heat treatment apparatus related to the exemplary embodiment of the present disclosure will be described. In a pre-stage processing of the heat treatment apparatus, for example, a coating liquid containing a precursor of a carbon film is coated on a wafer W to form a SOC film, which is a coating film. When the wafer W is moved to the upper side of the heating plate 21 by a conveyance arm (not illustrated) in a state where the ring shutter 5 is moved down, the wafer W is delivered to the support pins 23 by a cooperative action of the conveyance arm and the support pins 23 at the lower side of the heating plate 21. At this time, the power of the heater 25 is controlled such that the temperature of the surface of the heating plate 21 is, for example, 350° C. Then, the ring shutter 5 is moved up to close the processing container 1, so that the processing space is defined. subsequently, the valves V1, V2 are opened to perform exhaust from the outer circumferential exhaust port 31 in an exhaust amount (flow rate) of, for example, 25 L/min and from the central exhaust port 34 in an exhaust amount of 5 L/min, thereby bringing the inside of the processing container 1 to a negative pressure state. Then, for example, substantially at the same time as the exhaust of the inside of the processing container 1, the support pins 23 are moved down to place the wafer W on the heating plate 21 of the bottom structure 2.

Figure 3:
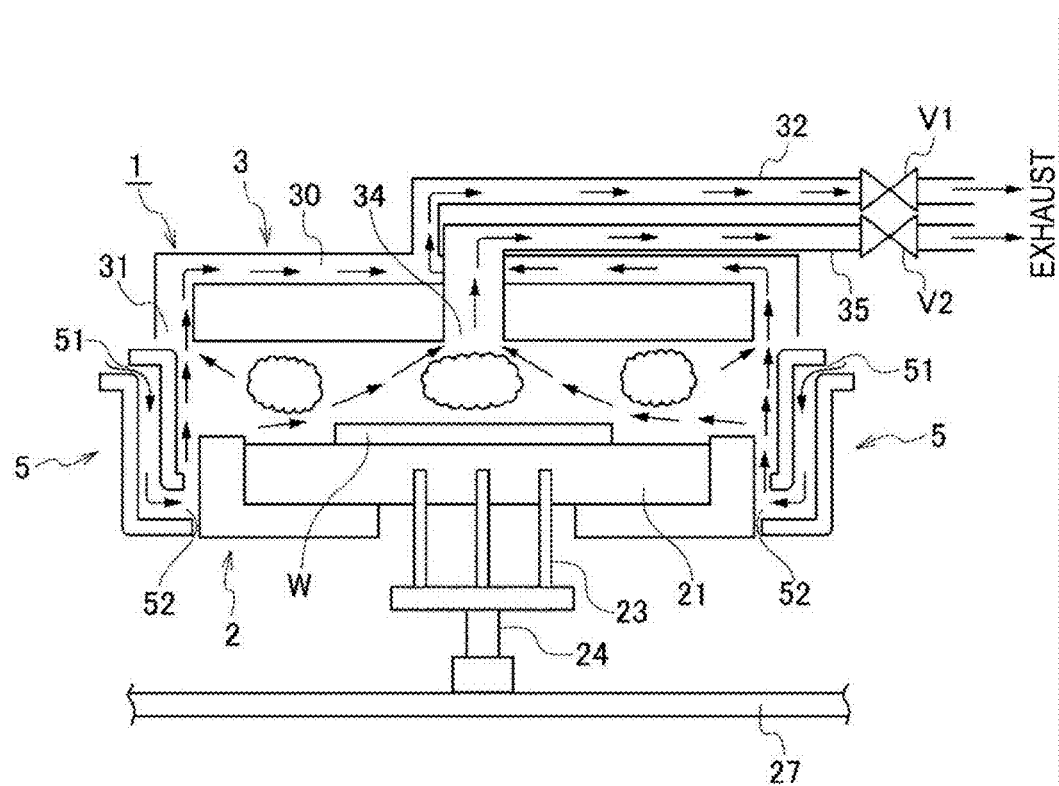
FIG. 3 is an explanatory view illustrating an action of a heat treatment apparatus related to an exemplary embodiment of the present disclosure.

As illustrated in FIG. 3, nitrogen gas, which is an inert gas atmosphere in the housing (not illustrated) that is an external atmosphere of the processing container 1, flows into the ring-shaped portion 50 from the suction ports 51 provided in the ring shutter 5, and also flows into the processing container 1 through the gas supply ports 52. Since the gas supply ports 52 of the ring shutter 5 are provided at a position lower than the height of the upper surface of the bottom structure 2, the nitrogen gas introduced into the processing space flows through the gap between the lateral surface of the bottom structure 2 and the ring shutter 5 toward the upper side. Further, in FIGS. 3, 5, and 7, the wafer W having a decreased surface fluidity due to the crosslinking reaction is indicated by hatching.

The air flow, which has risen to the outer periphery of the upper surface of the bottom structure 2, forms an air flow that flows directly to the upper side and is exhausted to the outer circumferential exhaust ports 31, and an air flow that flows toward the central portion of the bottom structure 2 along the upper surface of the bottom structure 2 and then is exhausted while rising toward the central exhaust port 34. A gas curtain is formed around the processing space.

Figure 4:
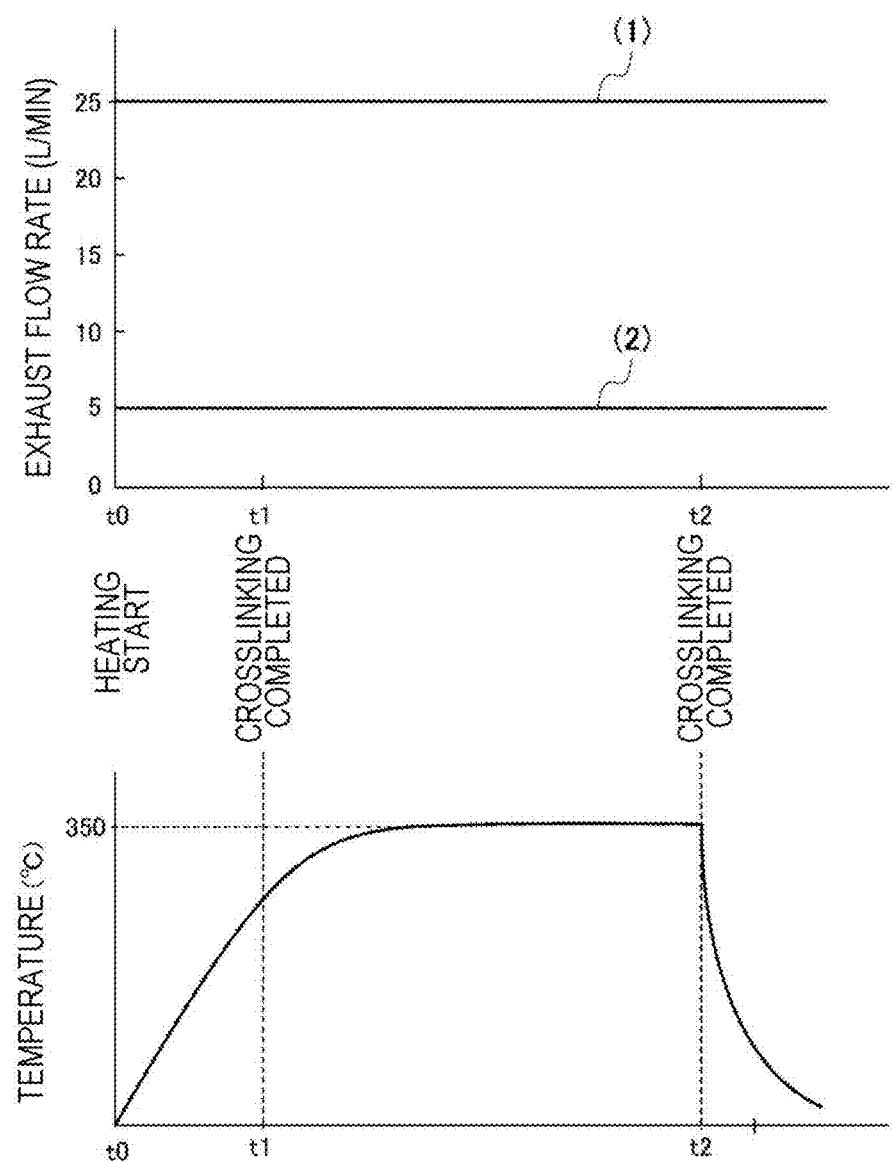
FIG. 4 is a time chart illustrating an exhaust sequence of the heat treatment apparatus and a temperature change of a wafer.

FIG. 4 illustrates graphs in which each exhaust amount of (1) the outer circumferential exhaust ports 31 and (2) the central exhaust port 34 with the temperature of the wafer W after the wafer W is placed on the heating plate 21 are represented in association with each other. The temperature of the wafer W is increased from heating start time t0 when the wafer W is placed on the heating plate 21. Thus, the crosslinking reaction proceeds with the crosslinking agent in the coating film (SOC film) while volatilization of a solvent in the coating film is promoted. The crosslinking reaction proceeds, for example, for about 20 seconds from time t0, and thus the coating film is in the high fluidity state. During that period, the crosslinking agent or low molecular weight components in the coating film are volatilized. As illustrated in FIG. 3, since the exhaust flow flowing toward the outer circumferential exhaust ports 31 side and the exhaust flow flowing toward the central exhaust port 34 side are formed in the processing container 1, the volatilized components are exhausted by being entrained in the exhaust flows.

In addition, the gas curtain is formed around the processing atmosphere by using the outer circumferential exhaust ports 31 to act a function of suppressing leakage of the volatilized components to the outside. Therefore, the exhaust amount directed to the central exhaust port may be reduced. Accordingly, the exhaust amount is set to a small flow rate of, for example, about 5 L/min. In the case where the exhaust flow rate of the central exhaust port 34 is high and the air flow flowing from the outside of the wafer W to the central exhaust port 34 is too strong, the center of the wafer W is swollen by the air flow, so that streak unevenness is formed on the surface of the wafer W and the in-plane uniformity of the film thickness is deteriorated. Whereas, when the exhaust flow rate of the central exhaust port 34 is a small flow rate of about 5 L/min, the swelling of the film or the formation of streak unevenness may be suppressed.

After the lapse of time t1 when the crosslinking reaction of the coating film is completed (the time point after 20 seconds from t0), the temperature of the wafer W is further increased to reach the surface temperature of the heating plate 21, for example, 350° C. Thereafter, the wafer W is maintained at this temperature so that the remaining thinner or the other components are volatilized or sublimated to modify the coating film. At time t2, for example, after 80 seconds from the heating start time t0 of the wafer W, the wafer W is moved up from the heating plate 21 by the support pins 23. After the crosslinking reaction is completed, the amount of the sublimate is increased. However, since the exhaust is performed from the central exhaust port 34 at a flow rate of 5 L/min, the sublimate is mainly exhausted by being entrained in the exhaust flow that flows from the outer circumference of the bottom structure 2 toward the central exhaust port 34. Thus, even if the exhaust amount from the outer circumferential exhaust ports 31 is a small flow rate of about 25 L/min, that is, even if the flow of the gas curtain surrounding the processing space is weak, the sublimate does not leak out to the outside of the processing container 1.

Assuming that, after the crosslinking reaction is completed, exhaust is only to rely on the outer circumferential exhaust ports 31 without performing the exhaust through the central exhaust port 34, as can be seen from data to be described later, the exhaust amount should be considerably increased, and the exhaust amount may exceed an exhaust amount assigned to the factory in a working area where a system including the heat treatment apparatus is placed.

Figure 5:
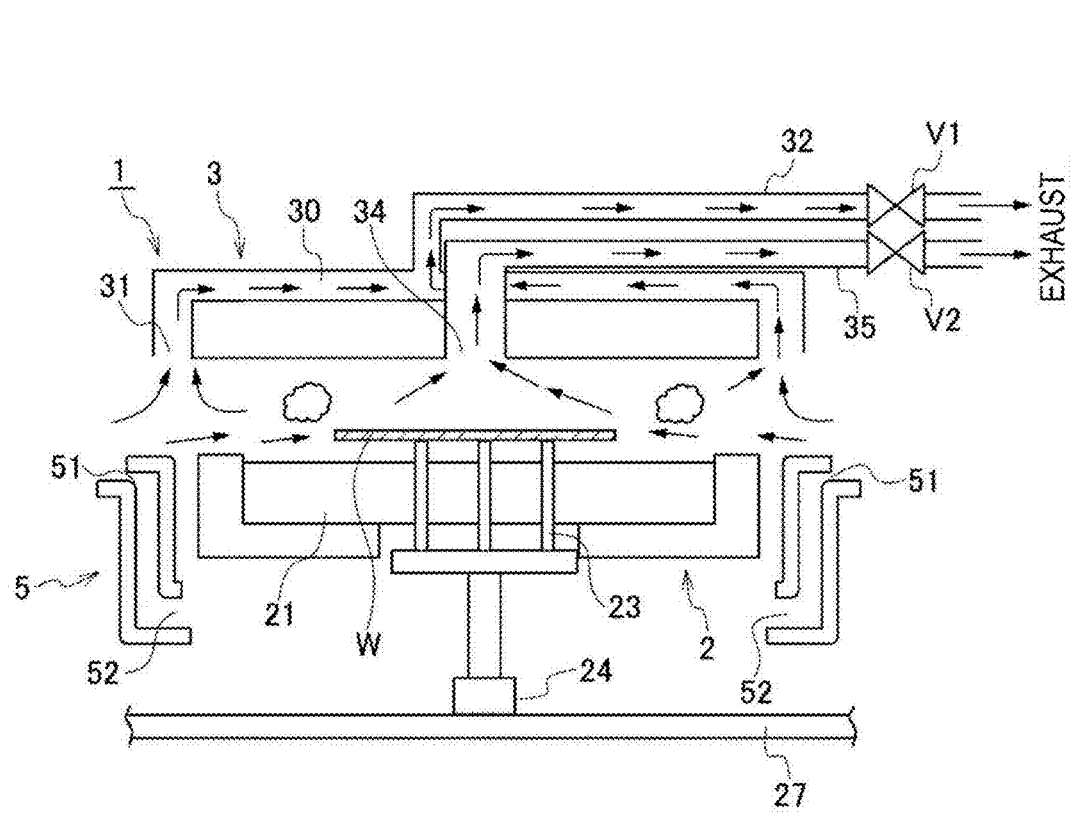
FIG. 5 is an explanatory view illustrating an action of a heat treatment apparatus related to an exemplary embodiment of the present disclosure.

FIG. 5 illustrates a state where the ring shutter 5 is opened after or simultaneously when the wafer W is moved up and separated from the heating plate 21 at time t2. When the ring shutter 5 is opened, the gap is opened so that the atmosphere in the processing container 1 tends to flow from the gap to the outside. However, since the exhaust from the outer circumferential exhaust ports 31 and the central exhaust port 34 continues, the external nitrogen gas is drawn into the processing space. Therefore, even in a case where the sublimate generated while performing the heat treatment of the wafer W is not completely exhausted, it is possible to suppress the leakage of the sublimate to the outside of the processing container 1.

According to the above-described exemplary embodiment, when the crosslinking reaction proceeds by placing the wafer W coated with the SOC film, which is the coating film, in the processing container 1, and heating the wafer W, the crosslinking reaction proceeds by performing the exhaust from the central exhaust port 34 in a small exhaust amount while performing the exhaust from the outer circumferential exhaust ports 31 in a large exhaust amount. Accordingly, when the fluidity of the SOC film is high, the center of the surface of the wafer W is not exposed to a strong air flow, so that swelling of the central portion may be suppressed, and deterioration of the in-plane uniformity of the film thickness may be avoided. The exhaust of the central exhaust port 34 is performed even after the crosslinking reaction is completed and the generation of the sublimate is increased. Thus, even if the exhaust amount of the outer circumferential port 31 is small, it is possible to suppress the leakage of the sublimate to the outside of the atmosphere in the processing container 1 during the processing, or even after the ring shutter 5 is opened. This is an effective technique in that there is a strong demand to suppress the exhaust amount in the factory from the viewpoint of prevention of environmental pollutions, and in that the exhaust amount of the whole heat treatment apparatus may be suppressed in the above-described exemplary embodiment.

Figure 6:
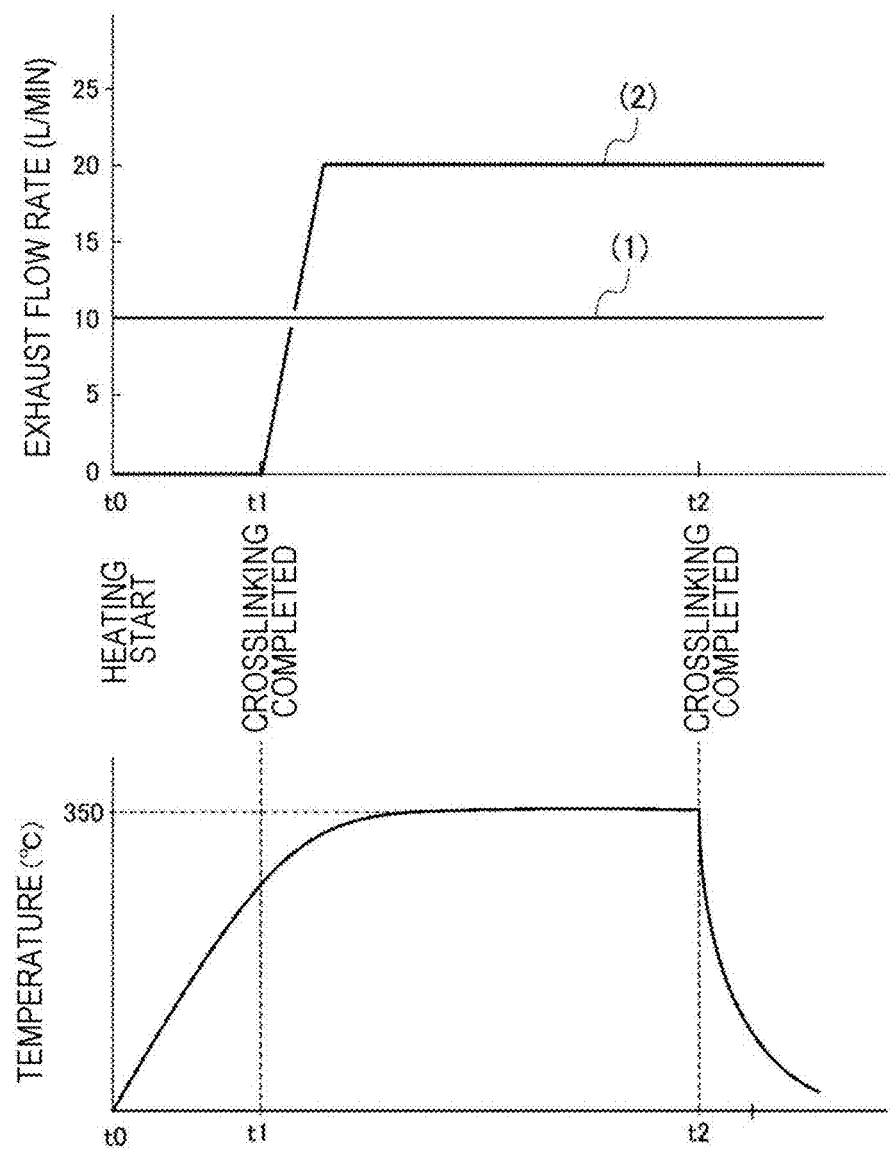
FIG. 6 is a time chart illustrating an exhaust sequence of the heat treatment apparatus and a temperature change of a wafer.

Another exemplary embodiment of the present disclosure will be described. For example, only the exhaust by the outer circumferential exhaust ports 31 may be performed from the heating start of the wafer W, and, after the crosslinking reaction is completed, that is, after the lapse of a setting time from the heating start of the wafer W, the exhaust from the central exhaust port 34 may be performed in addition to the exhaust from the outer circumferential exhaust ports 31. FIG. 6 illustrates a time chart in another exemplary embodiment of the present disclosure. Graph (1) represents the exhaust amount of the outer circumferential exhaust ports 31, and Graph (2) represents the exhaust amount of the central exhaust port 34.

In the exemplary embodiment, after the wafer W is supported by the support pins 23, the valve V1 is opened, the exhaust is performed from the outer circumferential exhaust ports 31 at a flow rate of 10 L/min, and then or at the same time, the ring shutter 5 is closed. Subsequently, at time t0, the wafer W is placed on the bottom structure 2 and heating is started. Then, after 20 seconds from the heating start time t0 of the wafer W, the crosslinking reaction is completed. At time t1 when the fluidity of the SOC film is reduced, the valve V2 is opened, and the exhaust from the central exhaust port 34 is started in the exhaust amount of 20 L/min, in addition to the exhaust of the outer circumferential exhaust ports 31. For the exhaust of the central exhaust port 34, a sequence is organized such that the exhaust amount is gradually increased by the flow rate adjusting unit 38, for example, from time t1, and reaches the exhaust amount of 20 L/min, for example, at a time point when 10 seconds have elapsed from time t1.

In the exemplary embodiment, since the exhaust depends on the outer circumferential exhaust ports 31 without performing the exhaust of the central exhaust port 34 during the period from time t0 to time t1 when the crosslinking reaction of the SOC film proceeds, the central portion of the surface of the wafer W is not exposed to the strong air flow flowing from the outer circumference to the central upper side. Therefore, the occurrence of swelling of the central portion of the wafer W may be suppressed. Further, in this time zone, since the amount of the volatile matter and sublimate from the SOC film is small, the particles are suppressed from leaking out from the processing container 1 only with the exhaust of the outer circumferential exhaust ports 31. Further, after time t1 when the crosslinking reaction of the SOC film is completed, the fluidity of the central surface of the wafer W is reduced. Thus, the surface of the film hardly swells even if the surface of the wafer W is exposed to the strong air flow.

Figure 7:
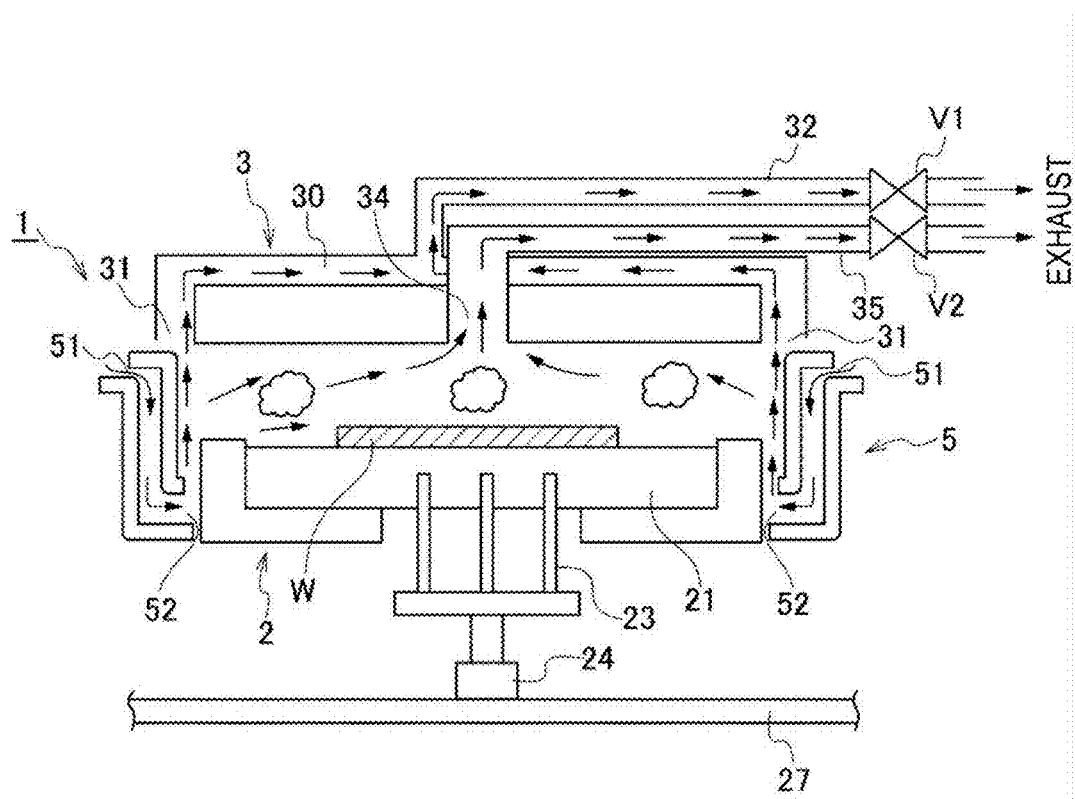
FIG. 7 is an explanatory view illustrating an action of a heat treatment apparatus related to another exemplary embodiment of the present disclosure.

Thus, as illustrated in FIG. 7, in addition to the exhaust from the outer circumferential exhaust ports 31, the exhaust from the central exhaust port 34 may be performed in a large exhaust amount. Therefore, the sublimate may be efficiently removed even under a situation where the generation of the sublimate from the SOC film is increased. Further, in a case where the ring shutter 5 is opened after the completion of the heat treatment of the wafer W, since an air flow flowing from the gap into the outer circumferential exhaust ports 31 is formed as in FIG. 5, the leakage of the atmosphere in the processing container 1 to the outside may be suppressed. Since the exhaust from the central exhaust port is performed in a large exhaust amount in this way, the exhaust amount from the outer circumferential exhaust ports 31 may be reduced, and consequently, the entire exhaust amount may be reduced.

Figure 8:
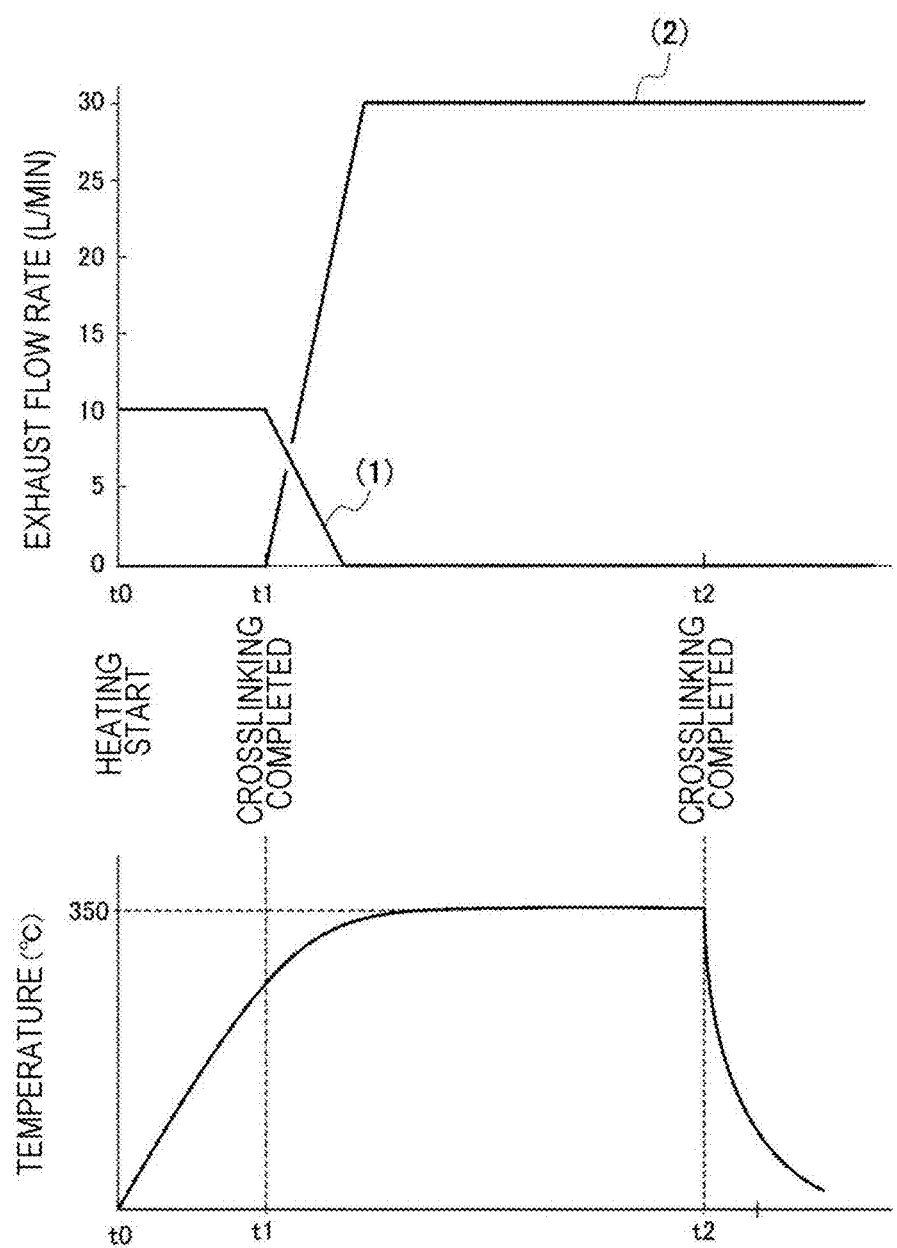
FIG. 8 is a time chart illustrating an exhaust sequence of the heat treatment apparatus and a temperature change of a wafer.

Further, for example, when the wafer W is heated, the exhaust from the outer circumferential exhaust ports 31 may be switched to the exhaust from the central exhaust port 34. FIG. 8 illustrates a time chart in still another exemplary embodiment of the present disclosure. Graph (1) represents the exhaust amount of the outer circumferential exhaust ports 31, and Graph (2) represents the exhaust amount of the central exhaust port 34. In the exemplary embodiment, after the wafer W is supported by the support pins 23, the exhaust is first performed from the outer circumferential exhaust ports 31 in an exhaust amount of 10 L/min, and then or at the same time, the ring shutter 5 is closed. Subsequently, at time t0, the wafer W is placed on the bottom structure 2 and heating is started. Then, the exhaust is performed only from the outer circumferential exhaust ports 31 for 20 seconds from the heating start time t0 of the wafer W to time t1, and then, the crosslinking reaction is completed after 20 seconds from the heating start time t0 of the wafer W. At time t1 when the fluidity of the SOC film is reduced, the exhaust amount of the outer circumferential exhaust ports 31 is gradually decreased, and the exhaust is stopped, for example, after 10 seconds from time t1. Meanwhile, the exhaust amount of the central exhaust port 34 is gradually increased from time t1, so that the exhaust is performed in an exhaust amount of 30 L/min, for example, after 10 seconds from time t1.

In the exemplary embodiment, during the period from time t0 to time t1 when the crosslinking reaction of the SOC film proceeds, since the central portion of the surface of the wafer W is not exposed to the strong air flow flowing from the outer circumference to the center, the swelling of the central portion of the wafer W may be suppressed from being generated. Further, in this time zone, since the amount of the volatile matter and sublimate from the SOC film is small, the particles are suppressed from leaking out from the processing container 1, only with the exhaust of the outer circumferential exhaust ports 31. Further, after time t1 when the crosslinking reaction of the SOC film is completed, the surface of the film hardly swells even if the surface of the wafer W is exposed to the strong air flow. Thus, the exhaust from the central exhaust port 34 may be performed in a large exhaust amount. Therefore, the sublimate may be efficiently removed even under a situation where the generation of the sublimate from the SOC film is increased. Further, in a case where the ring shutter 5 is opened after the completion of the heat treatment of the wafer W, the leakage of the sublimate to the outside of the processing container 1 may be suppressed by sufficiently exhausting the sublimate by the exhaust from the central exhaust port 34 in advance.

Here, in performing the sequences illustrated in FIGS. 6 and 8, the timing of the exhaust start of the central exhaust port 34 may be managed by a time period elapsed from time t0 that is the heating start time of the wafer W, but may be managed by detecting that the temperature of the wafer W becomes a setting temperature. That is, the time point when a setting time has elapsed from the heating start time of the wafer W, or a setting time point when a temperature of the wafer W exceeds a setting temperature, may be set, for example, as an exhaust start time point of the central exhaust port 34. In addition, the detection of the temperature of the wafer W may be performed by providing a temperature detecting unit such as, for example, a thermocouple, in the heating plate 21.

In addition, the setting time point refers to a time point when the crosslinking reaction of the coating film is completed, but the "time point when the crosslinking reaction is completed" as mentioned in the claims is a time point in a state where it is determined from a common-sense point of view for all to see that the coating film has no fluidity, and includes even a time slightly after the time point when the crosslinking reaction is completed, for example, 1 second after, or, for example, 2 seconds before the time point when the crosslinking reaction is completed. Further, for example, in Example 5 (to be described later), the exhaust is performed by setting the exhaust amount of the central exhaust port 34 to 25 L/min at 20th second after the heating start. However, when the exhaust is started slightly before the 20th second after the heating start, the film thickness in the center of the wafer W is swollen. Accordingly, in the case where the exhaust of the central exhaust port 34 is performed at the exhaust amount of 25 L/min after a certain timing, a time point behind the timing when the film thickness in the center of the wafer W is clearly swollen, may be referred to as the "time point when the crosslinking reaction is completed."

Further, after 20 seconds has elapsed from the heating of the wafer W and the crosslinking reaction is completed, the sublimate may be efficiently exhausted. For that reason, the exhaust amount of the central exhaust port 34 may be larger than the exhaust amount of the outer circumferential exhaust ports 31. However, whether it is appropriate to increase the exhaust amount of the central exhaust port 34 or to increase the exhaust amount of the outer circumferential exhaust ports 31 varies depending on the kind, viscosity, or difference in film thickness of the coating film, or the shape of the processing container 1.

Further, during the heat treatment of the wafer W, the exhaust amount may be changed with the time elapsed from the heating start without being limited to a constant exhaust amount of the central exhaust port 34 or the outer circumferential exhaust ports 31. For example, the exhaust amount of the outer circumferential exhaust ports 31 may be set to 25 L/min and the exhaust amount of the central exhaust port 34 may be set to 5 L/min at the heating start of the wafer W. Then, after 20 seconds from the heating start of the wafer W, the exhaust amount of the outer circumferential exhaust ports 31 may be changed to 10 L/min and the exhaust amount of the central exhaust port 34 may be changed to 20 L/min. In addition, the exhaust amount may be set to be gradually increased or decreased as time passes. Further, the exhaust amounts of the central exhaust port 34 and the outer circumferential exhaust ports 31 once increase, and then, decrease. Alternatively, a case where the exhaust amounts once decrease and then increase, is also included in the case in which "the exhaust amounts increase or decrease over time."

Figure 9:
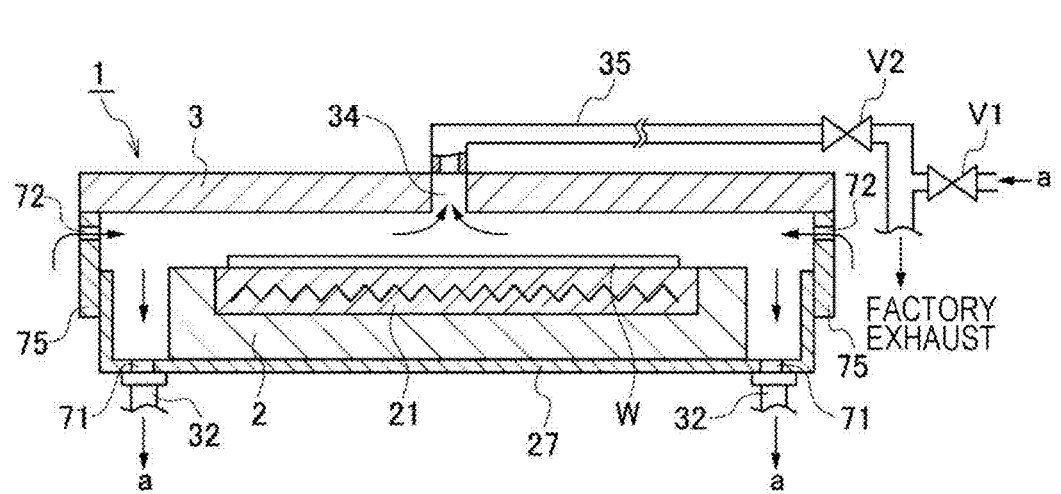
FIG. 9 is an explanatory view illustrating a heat treatment apparatus related to another exemplary embodiment of the present disclosure.

Further, in the heat processing apparatus of the present disclosure, as illustrated in FIG. 9, in the processing container 1, a gas supply port 72 of an external atmosphere may be provided at a position higher than the wafer W and an outer circumferential exhaust port 71 may be provided at a position lower than the wafer W. For example, a plurality of gas supply ports 72 may be provided circumferentially at a position above a ring shutter 75 and a plurality of outer circumferential exhaust ports 71 may be provided circumferentially in the base 27 that supports the bottom structure 2. Further, in FIG. 9, the gas supply ports 72 may be opened at a position facing the outer circumferential exhaust ports 71 as the lower surface of the top plate 3, instead of being provided above the ring shutter 75. In this case, a gas supply path is formed in the top plate 3, and for example, a base end side is opened on the lateral surface of the top plate 3. With such a configuration, a curtain of an exhaust flow flowing from the top plate 3 toward the lower side is formed in the outer side of the bottom structure 2. Further, the present disclosure may be applied to a heat treatment apparatus that performs a heat treatment after a coating liquid used for, for example, an antireflective layer is coated, without being limited to the heat treatment apparatus that heats the SOC film.

Figure 10C:
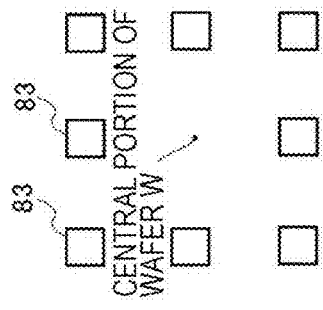
FIGS. 10A to 10E are plan views illustrating different examples of a central exhaust port.
Figure 10B:
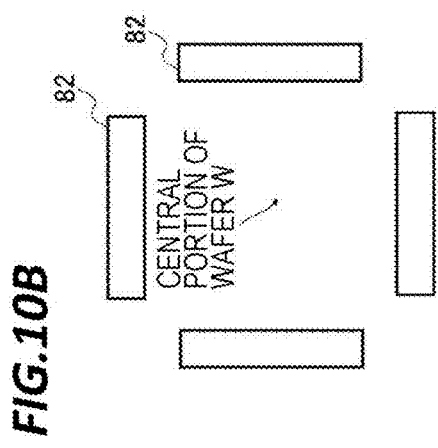
Figure 10E:
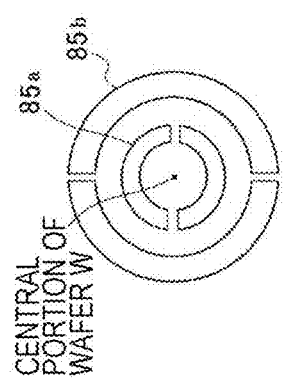
Figure 10A:
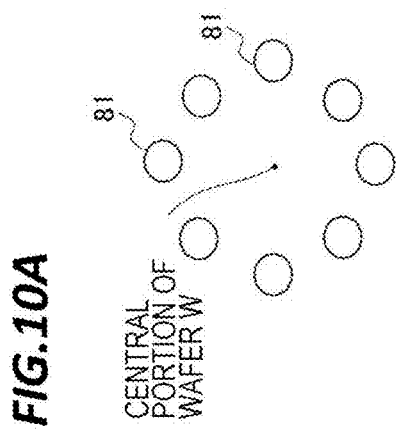
Figure 10D:
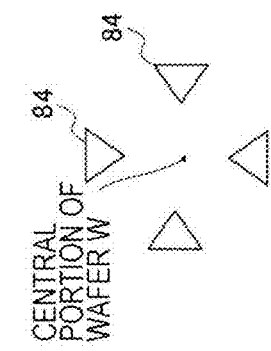

Further, the central exhaust port 34 is not limited to the configuration in which one central exhaust port 34 is provided in the central portion at the lower surface side of the top plate 3 in the processing container 1. For example, as illustrated in FIG. 10A, a plurality of (e.g., eight) circular exhaust ports 81 may be provided circumferentially at equal intervals on a periphery of a circle around the central portion of the wafer W, in a plan view, to serve as the central exhaust port 34. Further, as illustrated in FIG. 10B, slit-shaped opening portions 82 may be provided at four places dislocated by 90 degrees around the central portion of the wafer W, in a plan view, to constitute the central exhaust ports 34. Alternatively, as illustrated in FIG. 10C, for example, eight rectangular opening portions 83 may be arranged along a square around the central portion of the wafer W, in a plan view, to serve as the central exhaust ports 34, or as illustrated in FIG. 10D, four triangular opening portions 84 may be arranged circumferentially at equal intervals around the central portion of the wafer W to serve as the central exhaust ports 34. Furthermore, as illustrated in FIG. 10E, the central exhaust ports 34 may be constituted with double circular slits 85a, 85b (specifically, arc-shaped because bridge portions are present in the middle of the slits 85a, 85b) concentrically around the central portion of the wafer W. As such, when the central exhaust ports 34 are arranged circumferentially symmetrically with respect to the central upper side of the wafer W, an air flow flowing from each direction of the peripheral portion of the wafer W toward the central upper side of the wafer W with high uniformity may be formed by the external atmosphere supplied to the processing container 1. Therefore, since the sublimate may be efficiently recovered, the same effect is obtained.

Further, when the installation position of the outer circumferential exhaust ports 31 is close to the center of the top plate 3 of the processing container 1, a sublimate recovery efficiency is increased, but the film thickness uniformity tends to be deteriorated. On the other hand, the installation position of the outer circumferential exhaust ports 31 is far from the center of the top plate 3 of the processing container 1, the film thickness uniformity is enhanced, but the sublimate recovery efficiency is deteriorated. Further, when the opening diameter of the outer circumferential exhaust ports 31 is reduced, the flow velocity is increased, so that the sublimate recovery efficiency is enhanced. Thus, the outer circumferential exhaust ports 31 may be positioned on a circumference of 280 mm to 320 mm, for example, 300 mm in diameter around the center of the top plate 3 of the processing container 1, and the opening diameter of the outer circumferential exhaust ports 31 may be 1 mm to 3 mm, for example, 2 mm.

Figure 11:
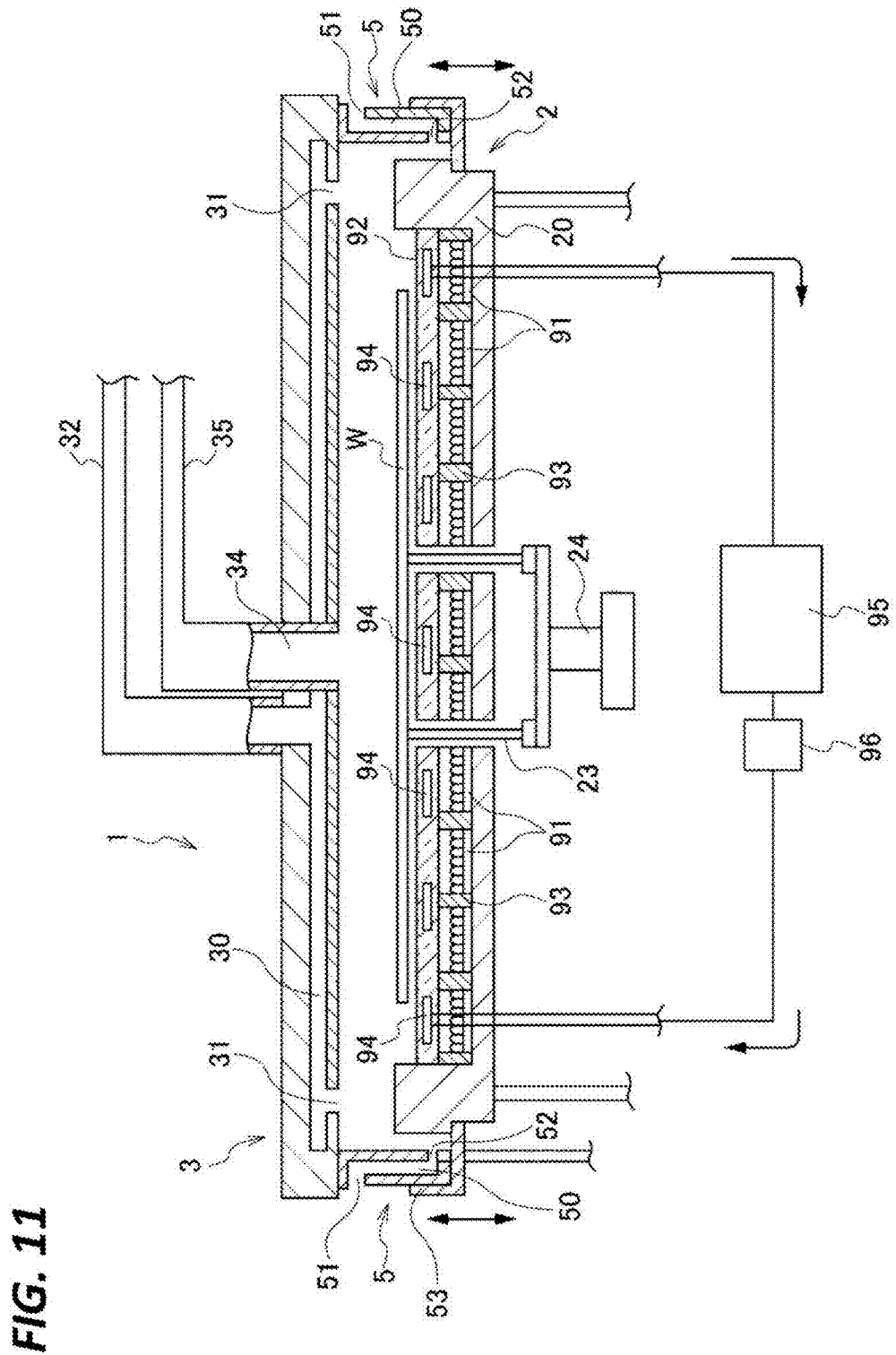
FIG. 11 is a vertical sectional side view illustrating a heat treatment apparatus including a heating unit related to another example.

Further, the heating unit that heats the wafer W may be, for example, a heat radiation source that heats the wafer W by irradiating lights from a light source such as, for example, LED. As such an example, a configuration may be exemplified, in which, instead of the heating plate 21 of the bottom structure 2, an LED array 91 serving as the heat radiation source is provided on the bottom surface of the recess of the support base 20, for example, as illustrated in FIG. 11. The LED array 91 is surrounded by a reflector 93 obtained by plating gold on a copper (Cu) plate, over its entire circumference, and configured such that radiant lights are effectively extracted by reflecting lights travelling in a direction different from the irradiation direction (upper direction in FIG. 11).

Further, a transmission plate 92 made of, for example, quartz is provided above the LED array 91 to separate an atmosphere in which the LED array 91 is disposed and a processing atmosphere. Further, a cooling line 94, which is a path to circulate a coolant, for example, cooling water, is provided inside the transmission plate 92. The transmission plate 92 also serves as a cooling member configured to cool the wafer W after the heat treatment. The cooling line 94 is connected to a chiller 95 and a circulation pump 96 provided outside the processing container 1, and the coolant circulating through the cooling line is adjusted to a setting temperature by the chiller 95, and sent to the inside of the transmission plate 92 by the circulation pump 96.

In this example, after the wafer W is delivered to the support pins 23, the wafer W is moved down, so that the wafer W is moved to a height in which the heat treatment is performed (heating height position). When the wafer W is held at the heating height position, infrared lights, which are radiant lights in an absorption wavelength region of the wafer W, are irradiated toward the wafer W by the LED array 91, so that the wafer W is heated to a predetermined heat treatment temperature. Therefore, in this example, the support pins 23 correspond to the placing unit.

Further, the wafer W may be heated by providing the LED array 91 above the wafer W placed on the bottom structure 2 and irradiating lights to the wafer W placed on the bottom structure 2 from the upper side.

Figure 12:
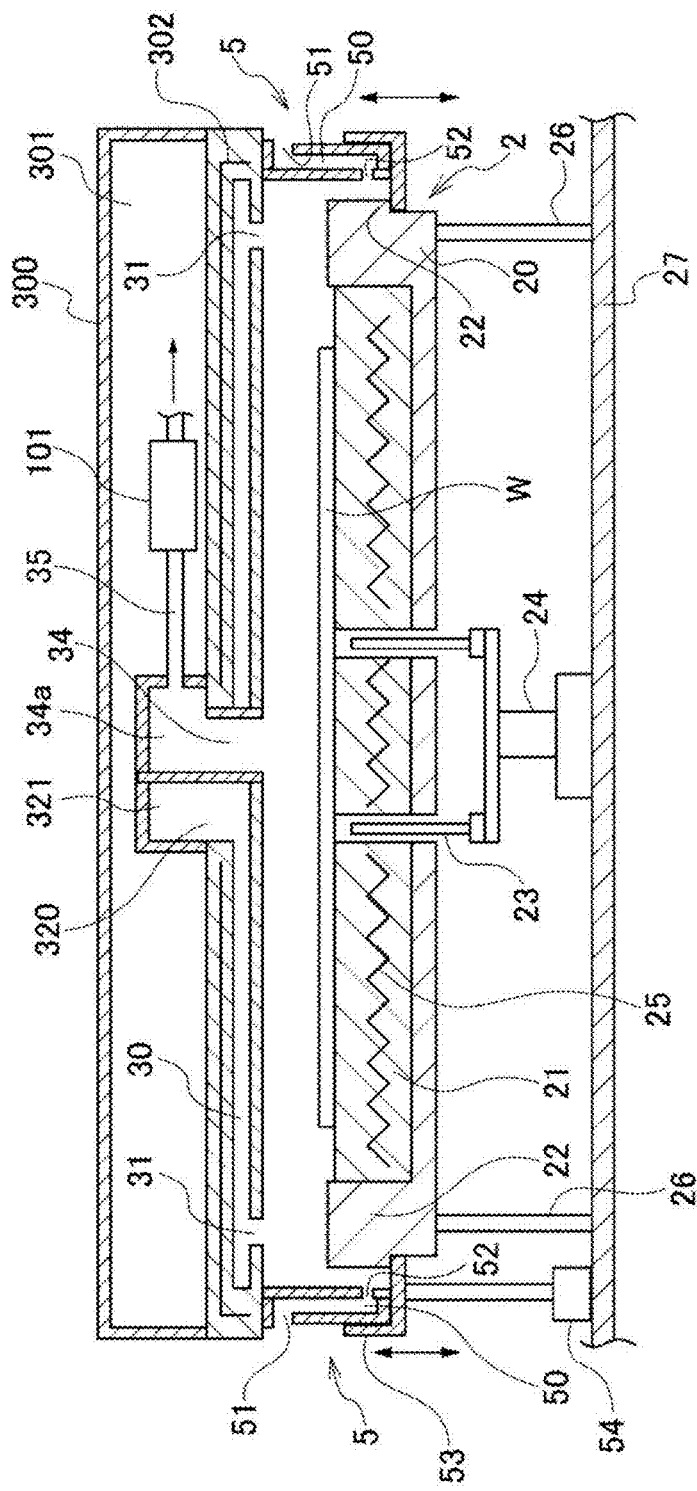
FIG. 12 is a vertical sectional side view illustrating a heat treatment apparatus including a mechanism that switches ON/OFF of exhaust.

Subsequently, still another exemplary embodiment of the present disclosure will be described. This exemplary embodiment is an example in which an ejector is used as a mechanism to switch ON/OFF of the exhaust of the central exhaust pipe 35. As illustrated in FIG. 12, the central exhaust pipe 35 is stretched along the upper surface of the top plate 3 from the central exhaust port 34 via a buffer chamber 34a, and is connected to a suction port of an ejector 101. The upper surface side of the top plate 3 is covered by a cover body 300 to be formed as a partitioned space 301 partitioned from the outside. The ejector 101 and its peripheral portion are arranged in the partitioned space 301. The top plate 3 is provided with a heater 302, and the partitioned space 301 is heated by the heater 302 to a temperature in which adhesion of the sublimate contained in the exhaust flows in the outer circumferential exhaust pipe 32 and the central exhaust pipe 35 can be suppressed, for example, 300° C.

Figure 13:
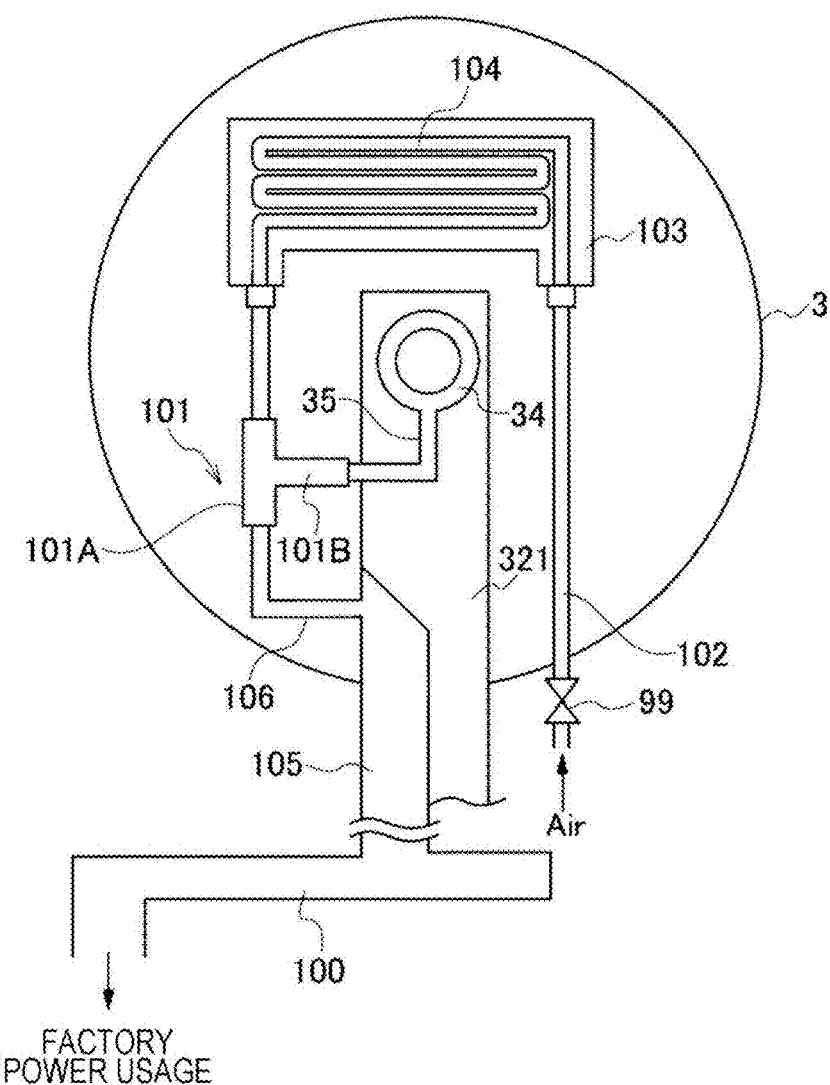
FIG. 13 is a plan view illustrating the mechanism that switches ON/OFF of exhaust.

FIG. 13 is a plan view illustrating the upper surface side of the top plate 3, and reference numeral 321 denotes an outer circumferential exhaust path constituted with a duct. The duct 321 communicates with the exhaust chamber 30 via an opening portion formed in the top plate 3, and its upstream side is arranged in a linear shape, as illustrated in FIG. 13, in the partitioned space 301 while surrounding the buffer chamber 35.

The ejector 101 and its peripheral portions will be described with reference to FIG. 13. Assuming that the downstream side of the outer circumferential exhaust path 321 is a front and the upstream side is a rear, an air supply pipe 102, which is a supply pipe of air serving as a suction gas of the ejector 101, is stretched from the front side to the rear side at the right side in FIG. 13 with respect to the central exhaust port 34. A valve 99 in the figure constitutes a supply/stop mechanism of air. The air supply pipe 102 forms a bent path at the rear side of the central exhaust port 34 and is constituted as a heat exchange unit 103. The heat exchange unit 103 is made of, for example, a metal material having a good thermal conductivity, and includes a heating flow path 104 formed therein. The heating flow path 104 is stretched from the front right position to the rear side, then, bent from side to side multiple times, and opened to the left side of the front surface of the heat exchange unit 103, and a left side end portion of the heating flow path 104 is connected with one end of the exhaust pipe 106. The temperature of the air supplied to the heating flow path 104 is room temperature, and is increased up to a temperature in which adhesion of the sublimate can be suppressed by heat of the heater 302. Accordingly, a gas temperature adjusting mechanism is constituted by the heater 302 and the heat exchange unit 103.

The ejector 101 is constituted as a T-shaped piping structure in which a junction pipe path 101B is connected to a gas pipe path 101A stretched linearly from the side. One end side of the gas pipe path 101A is connected with a downstream end of the air supply pipe 102, and the other end (discharge side) of the gas pipe path 101A is connected to an exhaust duct 100 that is a downstream side exhaust path, which is routed around the factory, via the exhaust pipe 106 and an intermediate duct 105. The exhaust duct 100 is constantly exhausted by a factory power usage that is an exhaust power usage. Further, the junction pipe path 101B constituting a suction port of the ejector 101 is connected with a downstream end of the central exhaust pipe 35. Further, similarly to the heat exchange unit 103, the ejector 101 and the central exhaust pipe 35 are heated by the heat of the heater 302.

Actions of the above-described exemplary embodiment will be described with reference to the time chart illustrated in FIG. 6. First, only the exhaust by the outer circumferential exhaust ports 31 is performed from the heating start of the wafer W, and the exhaust from the central exhaust port 34 is performed, in addition to the exhaust from the outer circumferential exhaust ports 31, after the crosslinking reaction is completed, that is, after the lapse of a setting time from the heating start of the wafer W (in the example of FIG. 6, at time t1 that the crosslinking reaction is completed and the fluidity of the SOC film is reduced). When the exhaust from the central exhaust port 34 is started, the valve 99 is opened to start the supply of air from the air supply pipe 102, so that the air is supplied to the ejector 101 through the heat exchange unit 103.

When the air passes through the heat exchange unit 103, the air is heat-exchanged with the atmosphere in the partitioned space 301 that is heated by the heater 302, and is heated to a temperature in which a sublimate in a subsequently merged exhaust flow are not adhered, for a sufficient period of time. The heated air flows as a suction gas through the gas pipe path 101A of the ejector 101, and the inside of the junction pipe path 101B of the ejector 101 becomes a negative pressure to draw the gas at the central exhaust pipe 35 side. Accordingly, the atmosphere in the processing container 1 is exhausted from the central exhaust port 34. Then, the atmosphere in the processing container 1 drawn to the junction pipe path 101B is merged with the heated air flowing through the gas pipe path 101A, and then, exhausted to the exhaust duct 100 through the exhaust pipe 106 and the intermediate duct 105.

Since the air is heated as described above, the temperature of the exhaust flow merged from the junction pipe path 101B is not reduced so that the sublimate contained in the exhaust flow is suppressed from being precipitated at the exhaust duct 100 side.

Thereafter, in stopping the exhaust from the central exhaust port 34, the valve 99 is closed to stop the supply of the air from the air supply pipe 102. Thus, since the air does not flow through the gas pipe path 101A, the suction action in the junction pipe path 101B is lost, and the exhaust of the central exhaust pipe 34 is stopped.

According to the exemplary embodiment, the following effects are obtained. Since the upper side of the heat treatment apparatus is subject to a high temperature due to the influence of the heat treatment, for example, in a case where a valve device is provided to switch ON/OFF of the exhaust of the central exhaust port 34, a valve that is drivable at a high temperature is required, but such a valve is large and heavy. In contrast, by adopting the configuration in which the ejector 101 is provided in the central exhaust pipe 35, it is possible to make the apparatus simpler and smaller.

Here, the exhaust of the heat treatment apparatus is performed by the factory power usage, and it is always in an exhausted state by the factory power usage. Thus, the exhaust duct 100 is always under a negative pressure, and when it is attempted to stop the exhaust by stopping the supply of the air, the central exhaust pipe 35 connected to the ejector 101 easily becomes a negative pressure, and slight exhaust may be continued from the central exhaust port 34.

Figure 14:
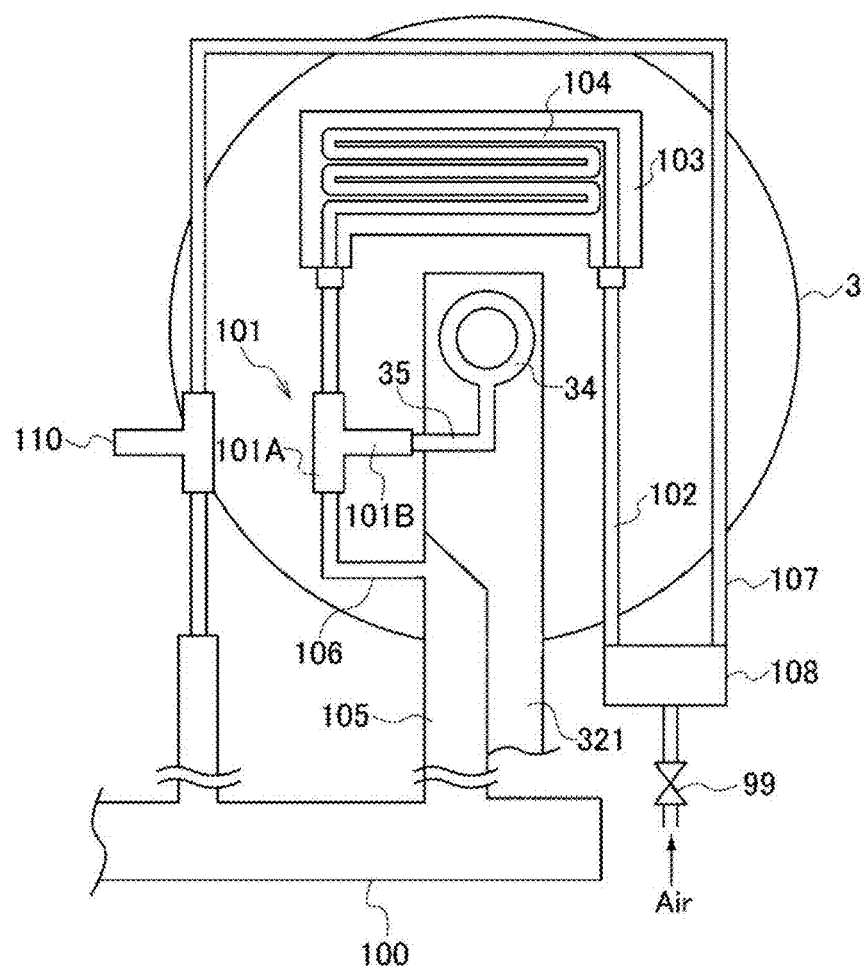
FIG. 14 is a plan view illustrating another example of the mechanism that switches ON/OFF of exhaust.

Therefore, it is advantageous to suppress the negative pressure of the central exhaust pipe 35 by connecting a dummy pipe to the exhaust duct 100. For example, as illustrated in FIG. 14, a dummy pipe 107 is connected to a downstream side of the connection position of the intermediate duct 105 through which the exhaust flow exhausted from the central exhaust port 34 flows, in the exhaust duct 100. Further, an air operation valve 108 is provided at an upstream side of the air supply pipe 102 to switch the pipe that performs the supply of air between the air supply pipe 102 and the dummy pipe 107.

In addition, an ejector 110 having the same configuration as that of the ejector 101 is provided in the middle of the dummy pipe 107 such that the air flowing through the dummy pipe 107 flows through a gas pipe path 110A of the ejector 110, and an end portion (suction port) of a junction pipe path 110B of the ejector 110 is opened to introduce an external atmosphere into the flow path through which the exhaust flow passes, for example, an external atmosphere into the partitioned space 301.

Figure 15:
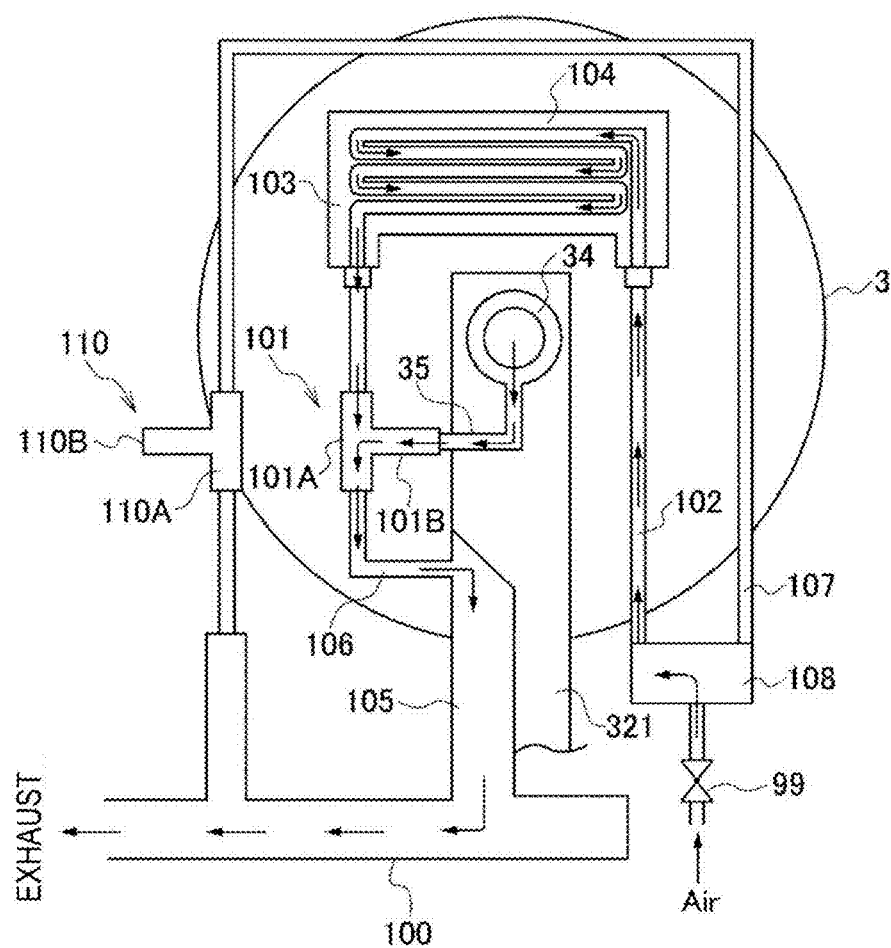
FIG. 15 is an explanatory view illustrating an action of another example of the mechanism that switches ON/OFF of exhaust.
Figure 16:
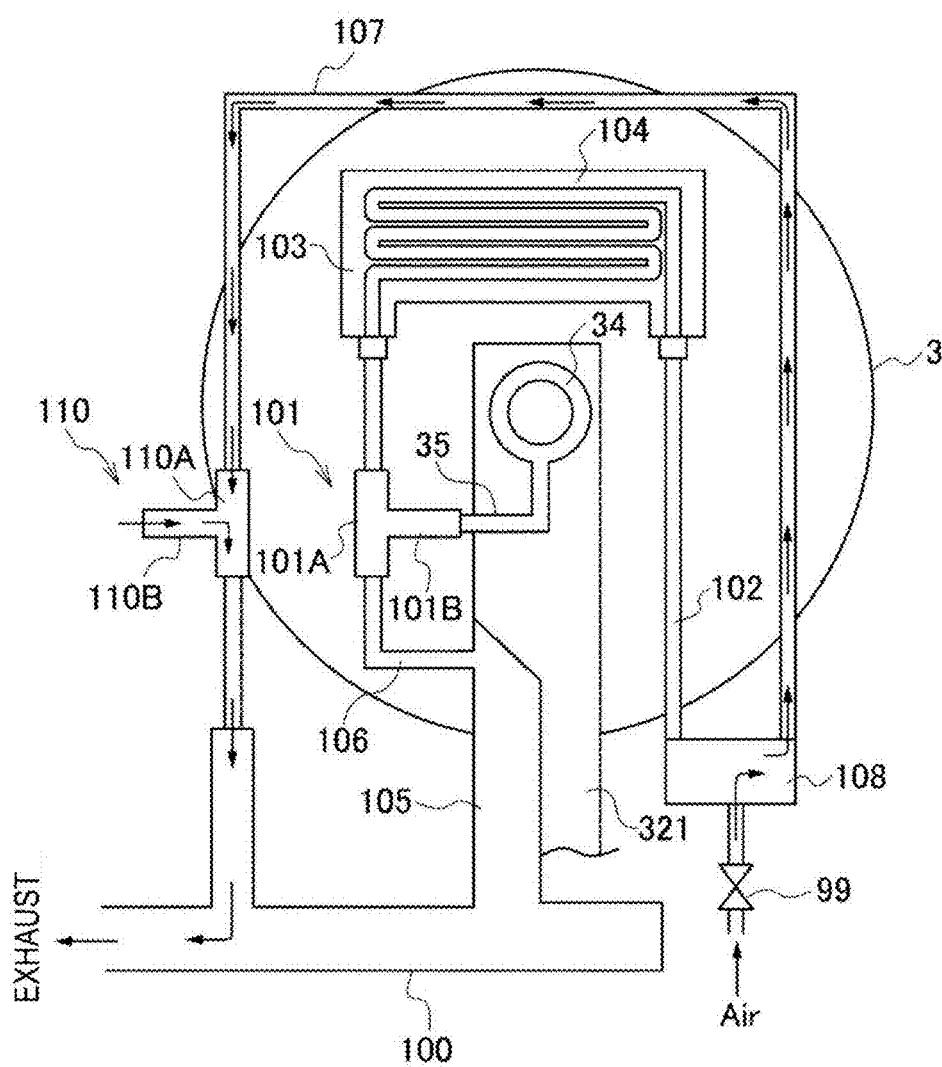
FIG. 16 is an explanatory view illustrating an action of another example of the mechanism that switches ON/OFF of exhaust.

In addition, when the exhaust from the central exhaust port 34 is performed, the air operation valve 108 is switched to perform the supply of air to the heat exchange unit 103 side, so that the exhaust from the central exhaust port 34 is performed as illustrated in FIG. 15. Thereafter, in stopping the exhaust from the central exhaust port 34, the air operation valve 108 is switched to stop the supply of air to the heat exchange unit 103 side as well as to start the supply of air to the dummy pipe 107. Accordingly, as illustrated in FIG. 16, the external atmosphere is drawn from the junction pipe path 110B of the ejector 110 provided in the dummy pipe 107, and flows into the exhaust duct 100. Thus, when the exhaust from the central exhaust port 34 is stopped, in a case where the exhaust duct 100 becomes a negative pressure, the atmosphere from the dummy pipe 107 flows therein, so that the negative pressure in the exhaust duct 100 is suppressed. Therefore, the draw-in of exhaust gas of the exhaust pipe 106 side is suppressed.

As such, when the dummy ejector 110 is combined with the dummy pipe 107 and draw-in of the dummy is performed during the stop of the exhaust flow, the flow rate when the exhaust flow is exhausted by the exhaust duct 100 using the ejector 101 and the flow rate at the time of draw-in of the dummy become equal. Thus, when an exhaust flow rate is set to be suitable for the time of the exhaust of the exhaust gas flow at the factory power usage, the generation of the negative pressure in the central exhaust pipe 35 may be suppressed with high certainty when the supply of the air is switched to the dummy pipe 107 side. Accordingly, the outflow of the processing atmosphere from the central exhaust port 34 may be suppressed. With such a configuration, for example, when the suction action of the ejector 101 is stopped, the exhaust flow rate from the central exhaust port 34 may be suppressed to a flow rate of 2 L/min or less.

Figure 17:
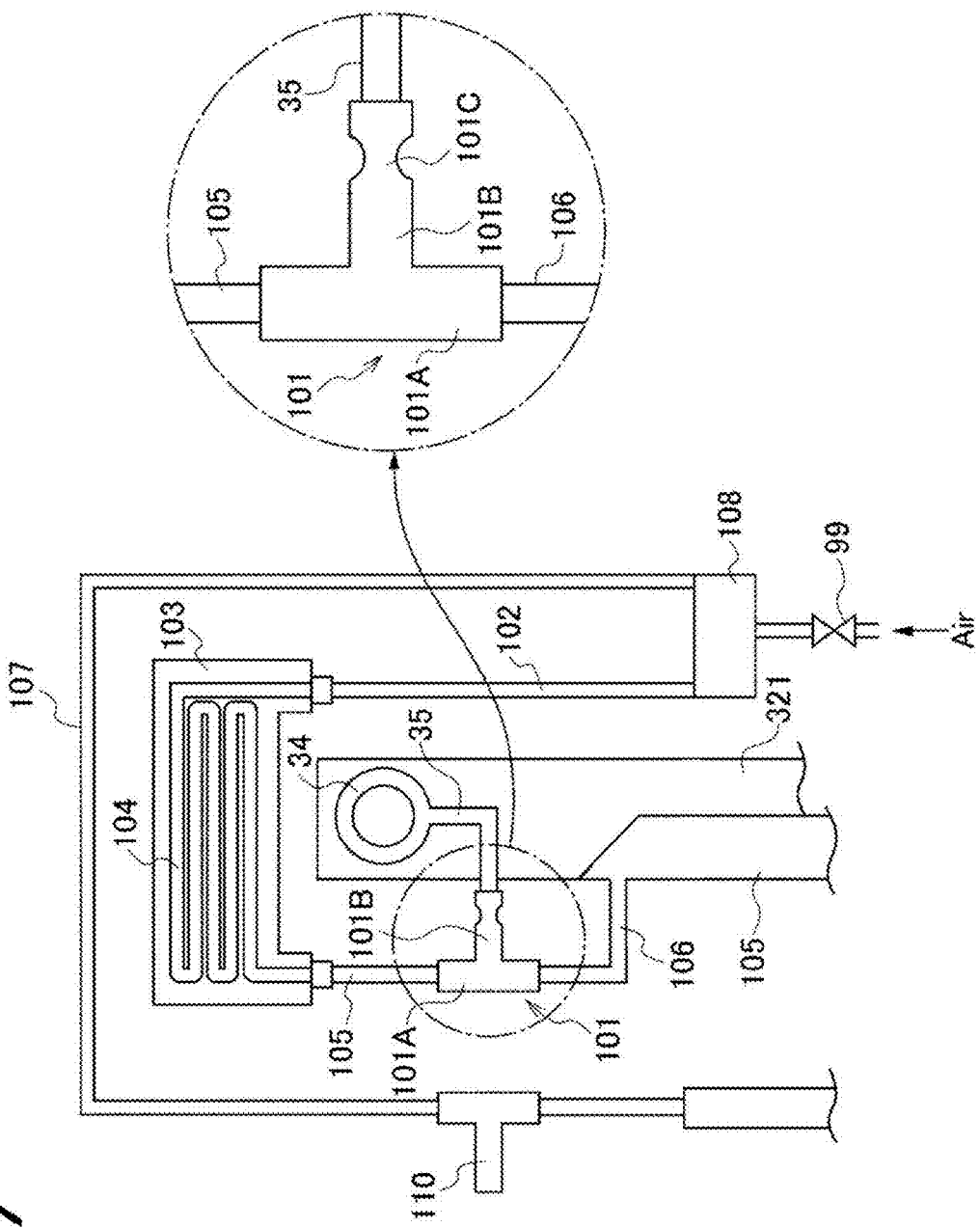
FIG. 17 is a plan view illustrating another example of the mechanism that switches ON/OFF of exhaust.

Further, as illustrated in FIG. 17, in addition to providing the dummy pipe 107, a pressure loss portion 101C may be provided in a portion of the junction pipe path 101B in the ejector 101 connected with the central exhaust pipe 35 such that the pressure loss of the ejector 101 at the central exhaust pipe 35 side is higher than that of the ejector 110 at the dummy pipe 107 side. The pressure loss portion 101C is constituted, for example, by reducing the diameter of a part of the flow path (making the caliber smaller than the front-and-rear portion). Thus, when the air operation valve 108 is further switched to stop the suction of the exhaust gas flow of the central exhaust pipe 35 side, it becomes easier to draw in the atmosphere of the dummy pipe 107 side. Therefore, the outflow of the processing atmosphere from the central exhaust port 34 may be suppressed. The above-described effect is obtained by providing the pressure loss portion 101C in the middle of the exhaust path from the exhaust port 34 to the portion merged with the air in the ejector 101, without being limited to the position illustrated in FIG. 17.

Figure 18:
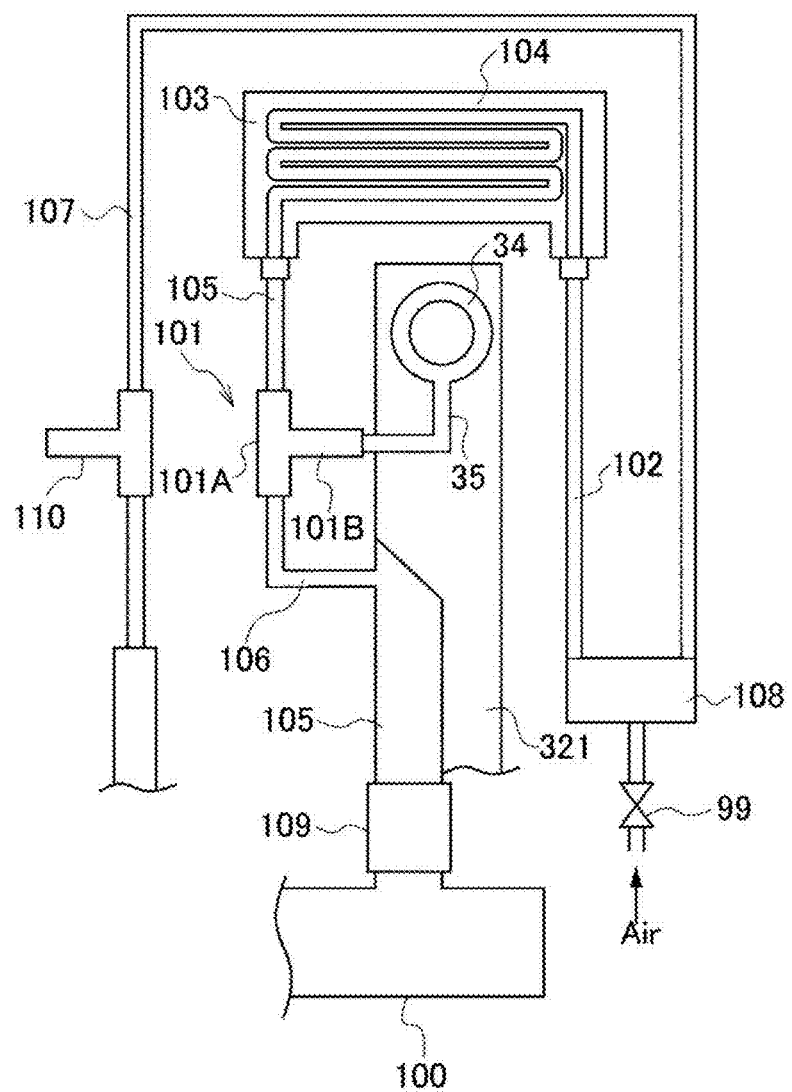
FIG. 18 is a plan view illustrating another example of the mechanism that switches ON/OFF of exhaust.

Further, as illustrated in FIG. 18, a check valve 109 may be provided in the exhaust pipe 106. In this case, the check valve 109 may be configured not to allow a gas to flow therethrough unless there is a large pressure difference between the upstream side and the downstream side of the check valve 109. With such a configuration, since the gas of the ejector 101 side is prevented from flowing through the check valve when the suction action of the ejector 101 is stopped, the same effect may be obtained.

Example 1

Descriptions will be made on examples which were performed to verify the effect of the exemplary embodiments of the present disclosure. A wafer W coated with a SOC film was heated at 350° C. using the heat treatment apparatus described in the exemplary embodiment of the present disclosure. Exhaust was performed using the central exhaust port 34 and the outer circumferential exhaust ports 31 until the wafer W was subjected to a heat treatment and taken out from the processing container 1, and then, the number of particles of 100 nm or more was counted at the outside of the processing container 1. The exhaust amount of the central exhaust ports 34 and the exhaust amount of the outer circumferential exhaust orts 31 in each examples were set as follows. Further, after the wafer W was carried into the processing container 1 and placed on the bottom structure 2, the heat treatment was performed for 80 seconds, and then, the ring shutter 5 was opened to take out the wafer W.

Example 1-1

The exhaust amount of the outer circumferential ports 31 was set to 20 L/min, and the exhaust amount of the central exhaust ports 34 was set to 10 L/min. The exhaust was performed from the outer circumferential exhaust ports 31 and the central exhaust port 34 during the period from the carry-in of the wafer W into the processing container 1 to the take-out of the wafer W.

Example 1-2

Except that the exhaust amount of the outer circumferential exhaust ports 31 was set to 25 L/min and the exhaust amount of the central exhaust ports 34 was set to 5 L/min, the others were set to be the same as those in Example 1-1.

Example 1-3

Except that the exhaust amount of the outer circumferential exhaust ports 31 was set to 10 L/min, and after 20 seconds from the heating start, the exhaust was started from the central exhaust ports 34 in an exhaust amount of 5 L/min (the exhaust of the central exhausts 34 was performed in addition to the exhaust of the outer circumferential exhaust 31), the others were set to be the same as those in Example 1-1.

Example 1-4

Except that the exhaust amount of the outer circumferential exhaust ports 31 was set to 15 L/min and the exhaust amount of the central exhaust ports 34 was set to 15 L/min, the others were set to be the same as those in Example 1-3.

Example 1-5

Except that the exhaust amount of the outer circumferential exhaust ports 31 was set to 5 L/min and the exhaust amount of the central exhaust ports 34 was set to 25 L/min, the others were set to be the same as those in Example 1-3.

Reference Example

As Reference Example, a processing was performed in the same manner as in Example 1-1 except that the heat treatment of the wafer W was performed while the exhaust was performed using the outer circumferential exhaust ports 31 only without performing the exhaust from the central exhaust ports 34. In Reference Example, the exhaust flow rate of the outer circumferential ports 31 was set to 0, 5, 10, 30, 50, and 60 L/min.

Figure 19:
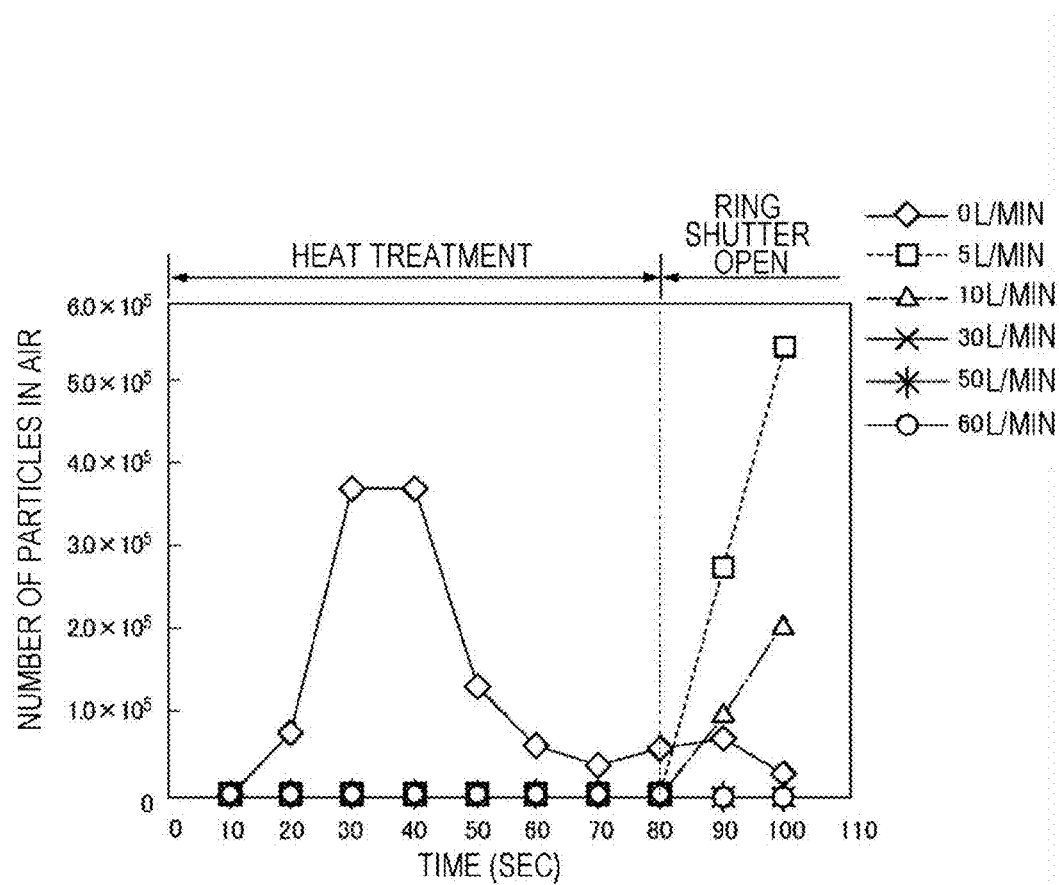
FIG. 19 is a characteristic diagram illustrating a time change of the number of particles observed in Reference Example.

FIG. 19 is a characteristic diagram illustrating a relationship between the time elapsed from the carry-in of the wafer W and the observed number of particles when the exhaust flow rate of the outer circumferential exhaust ports 31 was set to each flow rate in Reference Example. When the exhaust flow rate of the outer circumferential exhaust ports 31 was 0 L/min, that is, in the case where the exhaust was not performed, it is understood that the atmosphere containing the sublimate flowed out from the suction port before the ring shutter 5 was opened. Further, in a case where the flow rat of the exhaust was set to 0 to 50 L/min, after the ring shutter 5 was opened, particles were observed. In the case where the flow rate was set to 60 L/min, after the ring shutter 5 was opened, no particles was observed. Therefore, in the case where the exhaust was performed from the outer circumferential exhaust ports 31 only, it is found that it is necessary to set the exhaust flow rate to 60 L/min in order to suppress the leakage of the sublimate when the wafer W is taken out.

On the contrary, in Examples 1-1 and 1-2, no particle was confirmed not only during the heat treatment, but also after opening the ring shutter 5. Therefore, it is confirmed that the leakage of the sublimate may be suppressed by performing the exhaust using both of the central exhaust ports 34 and the outer circumferential exhaust ports 31. Further, similarly, in Examples 1-3 to 1-5, no particle was confirmed not only during the heat treatment, but also after opening the ring shutter 5. Even in a case where the exhaust is started from the central exhaust ports 34 after 20 seconds from the heating start of the wafer W, it is found that the sublimate may be sufficiently removed, and when the ring shutter 5 is opened, the leakage of the sublimate may be suppressed.

Figure 20:
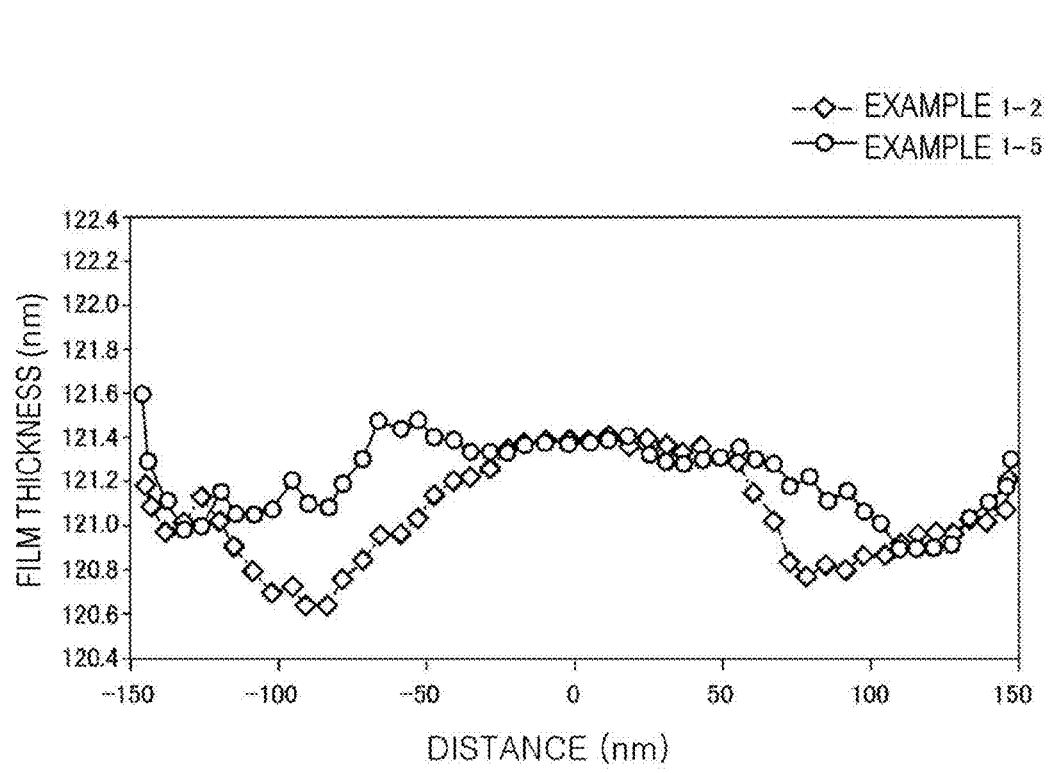
FIG. 20 is a characteristic diagram illustrating a film thickness distribution of wafers formed in Examples.

Further, FIG. 20 is a characteristic diagram illustrating a film thickness distribution on the diameter of the wafers W that were subjected to the heat treatment in Examples 1-2 and 1-5, in which the horizontal axis represents a distance from the diameter of the wafer W to the central portion, and the vertical axis represents a film thickness of the SOC film.

According to the result, swelling of the film in the center of the wafer W was suppressed, a difference between the maximum and the minimum of the film thickness of the SOC film was 0.73 nm in Example 1-2, and 0.71 nm in Example 1-5. Therefore, according to the exemplary embodiment of the present disclosure, it is found that a good in-plane uniformity is secured with respect to the film thickness of the wafer W that has been subjected to the heat treatment.

Example 2

In the central exhaust mechanism, it was examined for the existence/non-existence of sublimate clogging according to the existence/non-existence of the heat exchange unit 103.

Example 2-1

A test was performed by providing an exhaust on/off mechanism illustrated in FIG. 12 or 13 in the heat treatment apparatus illustrated in FIG. 1. The heating temperature of the heating plate 21 was set to 400° C., the heating temperature of the processing container 1 was wet to 300° C., the heating time of the wafer W was set to 60 seconds, and the cooling time after the heating was set to 24 seconds. Further, the flow rate of the central exhaust ports 34 was set to 40 L/min and the exhaust flow rate of the outer circumferential exhaust ports 31 was set to 20 L/min.

Comparative Example

A test was performed using the same heat treatment apparatus and the exhaust on/off mechanism as in Example 2 except that air was supplied from the air supply pipe 102 to the ejector 101 without providing the heat exchange unit 103. The heating temperature of the heating plate 21 was set to 450° C., the heating temperature of the processing container 1 was wet to 350° C., the heating time of the wafer W was set to 60 seconds, and the cooling time after the heating was set to 24 seconds. Further, the flow rate of the central exhaust ports 34 was set to 20 L/min and the exhaust flow rate of the outer circumferential exhaust ports 31 was set to 20 L/min.

In Example 2-1 and Comparative Example, after 2,500 sheets of wafers W were processed, an examination was performed with respect to adhesion of the sublimate in the ejector 100. In Comparative Example, the sublimate clogging was confirmed, and the exhaust flow rate was reduced to about 40% of the flow rate before the test. In contrast, in Example 2-1, no sublimate clogging was observed, and the exhaust flow rate was substantially 100% of the flow rate before the test.

According to the result, when the central exhaust mechanism is provided, it is found that adhesion of the sublimate may be suppressed by supplying air heated by the heat exchange unit 103, to the ejector 101.

Example 3

In order to verify the effect of the heat treatment apparatus including the exhaust on/off mechanism, the heat treatment was performed according to the following examples and an examination was performed with respect to the uniformity of the film thickness.

Example 3-1

After Coating Liquid A was coated on the wafer W, the heat treatment was performed according to the time chart illustrated in FIG. 6, using the heat treatment apparatus illustrated in FIG. 1. The flow rate of the central exhaust ports 34 was set to 20 L/min, the exhaust flow rate of the outer circumferential exhaust ports 31 was set to 20 L/min, and the exhaust was started from the central exhaust ports 34 after 20 seconds from the heating start.

Example 3-2

The processing was performed in the same manner as in Example 3-1 except that a heat treatment apparatus in which the heat treatment apparatus illustrated in FIG. 1 was connected with the exhaust on/off mechanism illustrated in FIG. 12 or 13, was used.

Example 3-3

The processing was performed in the same manner as in Example 3-1 except that Coating Liquid B was coated on the wafer W, and the exhaust was started from the central exhaust ports 34 after 15 seconds from the heating start.

Example 3-4

The processing was performed in the same manner as in Example 3-3 except that a heat treatment apparatus in which the heat treatment apparatus illustrated in FIG. 1 was connected with the exhaust on/off mechanism illustrated in FIG. 12 or 13, was used.

(Test Result)

Figure 21:
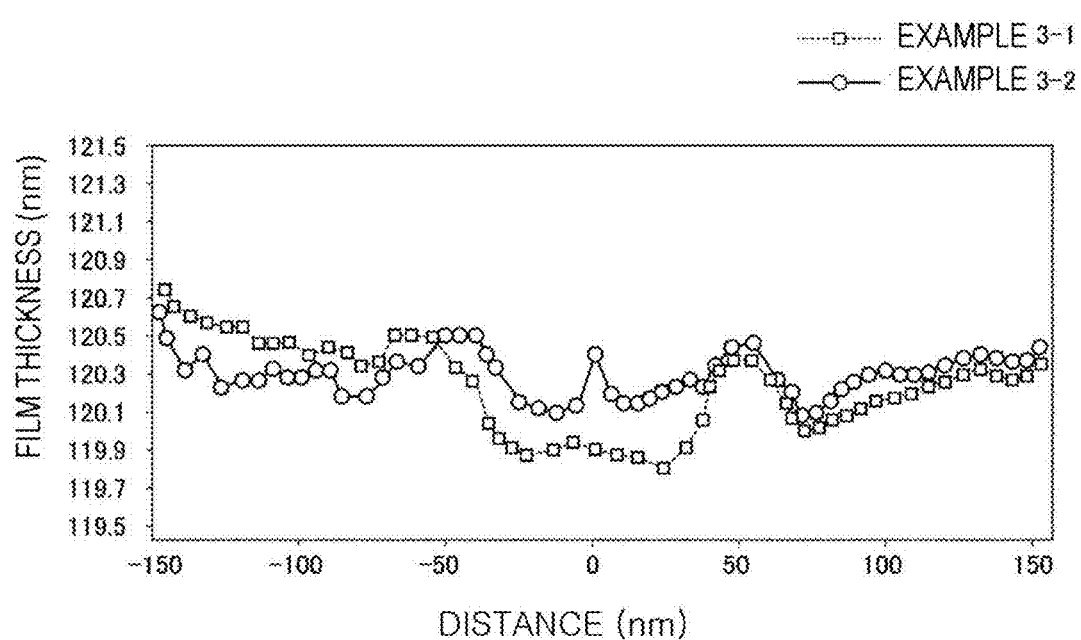
FIG. 21 is a characteristic diagram illustrating a film thickness distribution of wafers formed in Examples 3-1 and 3-2.
Figure 22:
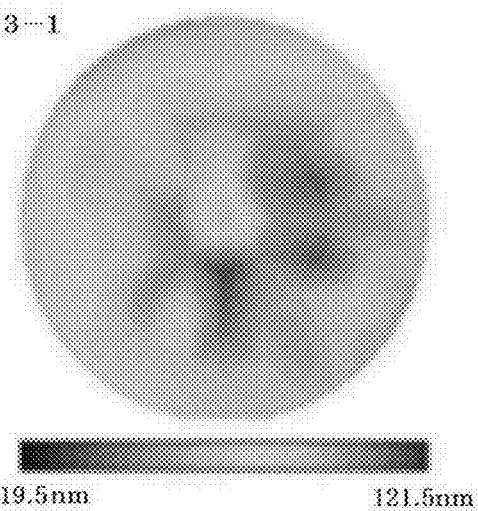
FIG. 22 is a characteristic diagram illustrating a film thickness distribution of a wafer formed in Example 3-1.
Figure 23:
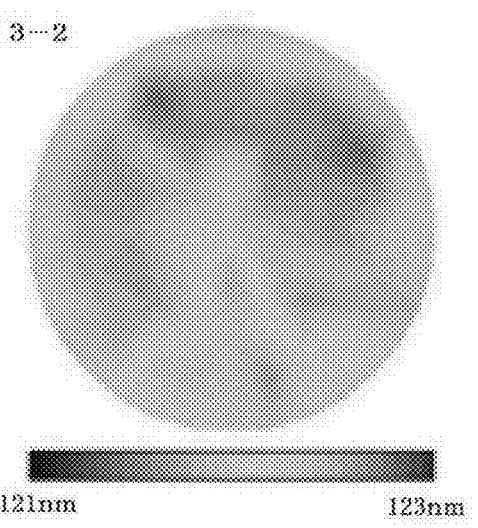
FIG. 23 is a characteristic diagram illustrating a film thickness distribution of a wafer formed in Example 3-2.
Figure 24:
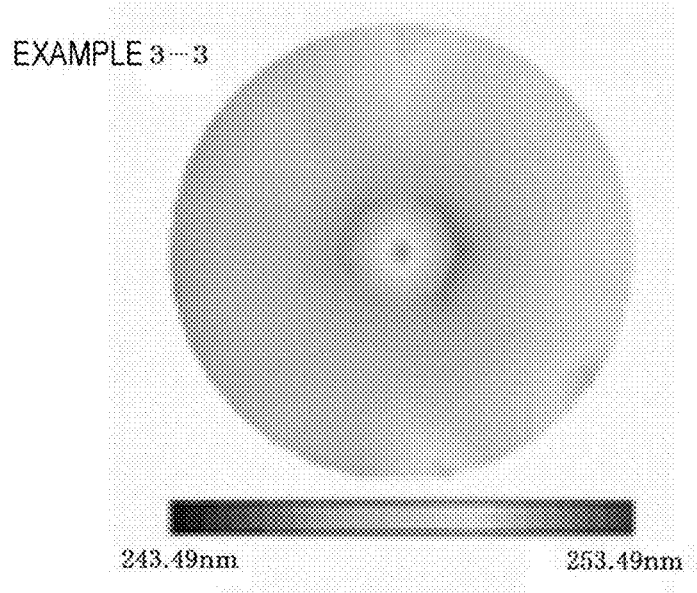
FIG. 24 is a characteristic diagram illustrating a film thickness distribution of a wafer formed in Example 3-3.
Figure 25:
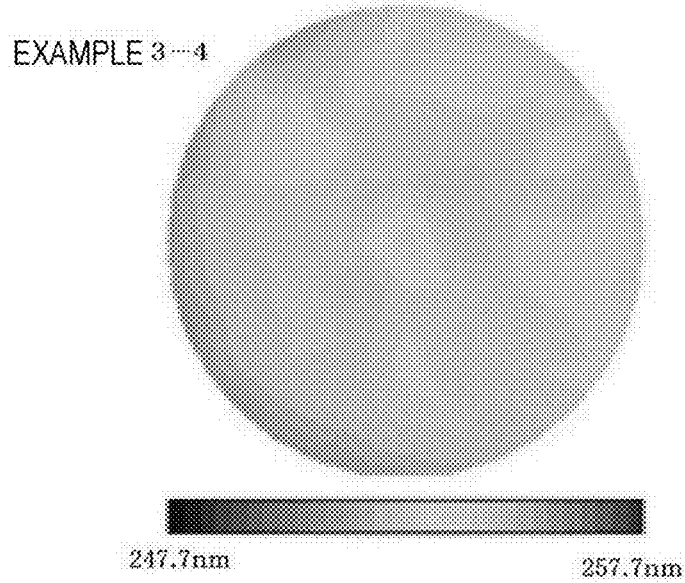
FIG. 25 is a characteristic diagram illustrating a film thickness distribution of a wafer formed in Example 3-4.

FIG. 21 is a characteristic diagram illustrating a film thickness on the diameter of the wafers W that were subjected to the heat treatment in Examples 3-1 and 3-2, in which the horizontal axis represents a distance from the diameter of the wafer W to the central portion, and the vertical axis represents a film thickness of the SOC films. Further, FIGS. 22 to 25 are characteristic diagrams illustrating a film thickness on the diameter of the wafers W that were subjected to the heat treatment in Examples 3-1 to 3-4, in a contour line.

In FIG. 21, a difference between the maximum and the minimum of the film thickness in the diameter of the wafers W was 1.03 nm in Example 3-1, and 0.52 nm in Example 3-2. Further, in FIGS. 22 to 25, using film thickness values at 80 points on the wafers W, as for Examples 3-1 and 3-2, the difference between the maximum and the minimum of the film thickness, and $3\sigma$ were measured, and as for Examples 3-3 and 3-4, $3\sigma$ was measured.

In Example 3-1, the difference between the maximum and the minimum of the film thickness, and $3\sigma$ were 1.47 nm and 0.94 nm, respectively, but in Example 3-2, the difference between the maximum and the minimum of the film thickness, and $3\sigma$ were 0.77 nm and 1.23 nm, respectively. Further, in Example 3-3, $3\sigma$ was 3.03 nm, but in Example 3-4, $3\sigma$ was 2.01 nm. Accordingly, the uniformity of the film thickness was good in Example 3-2 because the difference between the maximum and the minimum of the film thickness, and $3\sigma$ were all smaller than those in Example 3-1. Further, the uniformity of the film thickness was good in Example 3-4 because $3\sigma$ was smaller than those in Example 3-3.

According to the result, it is found that the uniformity of the film thickness becomes better by switching ON/OFF of the central exhaust using the exhaust on/off mechanism.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A heat treatment apparatus for performing a heat treatment on a coating film formed on a substrate, the apparatus comprising:
   a placing table provided within a processing container, and configured to place the substrate thereon;
   a heater configured to heat the substrate placed on the placing table;
   a top plate having a bottom surface which faces an upper surface of the placing table across a gap in the processing container, the top plate including:
      a plurality of outer circumferential exhaust ports opened circumferentially along and radially within an edge portion of the bottom surface of the top plate, and configured to exhaust an inside of the processing container; and
      a central exhaust port opened in a central portion at the bottom surface of the top plate such that a center of the central exhaust port coincides with a center of the substrate placed on the placing table, and configured to exhaust the inside of the processing container; and
   a cylindrical shutter provided to surround the placing table and configured to block an entire circumference of the gap formed between the placing table and the top plate to form a processing space in the processing container, the cylindrical shutter including a gas supply port formed at equal intervals over an entire circumference of an inner circumferential surface of the cylindrical shutter and configured to supply gas into the processing space of the processing container, wherein the gas supply port is opened at a position lower than the substrate.

2. The heat treatment apparatus of claim 1, wherein the outer circumferential exhaust port is opened at a position higher than the substrate, and
   an air flow curtain is formed to surround the substrate by an air flow flowing from the gas supply port to the outer circumferential exhaust port.

3. The heat treatment apparatus of claim 2, wherein the cylindrical shutter is configured to open/close a carry-in/out port that carries the substrate into/from the processing container, and
   wherein the air flow curtain is formed closer to the substrate side than the cylindrical shutter.

4. The heat treatment apparatus of claim 1, wherein the exhaust is performed at least from the outer circumferential exhaust port until a setting time point when a setting time has elapsed from a heating start time of the substrate or a setting time point when a temperature of the substrate exceeds a setting temperature, and the exhaust is performed at least from the central exhaust port after the setting time point.

5. The heat treatment apparatus of claim 4, wherein the exhaust is performed by the outer circumferential exhaust port and the central exhaust port at the same time at least from the heating start time of the substrate to the setting time point.

6. The heat treatment apparatus of claim 4, wherein the exhaust is performed by the outer circumferential exhaust port and the central exhaust port at the same time at least after the setting time point.

7. The heat treatment apparatus of claim 4, wherein an exhaust amount of the central exhaust port is larger than an exhaust amount of the outer circumferential exhaust port at least after the setting time point.

8. The heat treatment apparatus of claim 4, wherein at least one of the exhaust of the outer circumferential exhaust port and the exhaust of the central exhaust port is performed such that the exhaust amount increases or decreases with the lapse of time.

9. The heat treatment apparatus of claim 4, wherein a crosslinking agent is contained in the coating film, and
   the setting time point is a time point when a crosslinking reaction by the crosslinking agent is completed.

10. The heat treatment apparatus of claim 1, further comprising:
    an ejector connected to the central exhaust port through an exhaust path such that an exhaust flow is attracted by flow of a suction gas; and
    a supply/stop mechanism configured to perform supply of the suction gas to the ejector or stop of the supply.

11. The heat treatment apparatus of claim 10, further comprising:
    a mechanism for heating the suction gas.

12. The heat treatment apparatus of claim 10, wherein a discharge side of the ejector is connected to a downstream side exhaust path where exhaust is performed by an exhausting power usage,
    a second ejector is provided such that its discharge side is connected to the downstream side exhaust path, and is configured to attract an atmosphere outside a flow path of the exhaust flow by the flow of the suction gas, and
    when the supply of the suction gas is stopped by the supply/stop mechanism, the suction gas flows to the second ejector.

13. The heat treatment apparatus of claim 10, wherein a pressure loss portion is provided between the central exhaust port and the ejector that attracts the exhaust flow, to suppress the exhaust from the central exhaust port when the supply of the suction gas is stopped in order to stop the attraction of the exhaust flow.

14. A method for performing a heat treatment on a coating film formed on a substrate using a heat treatment apparatus that includes a placing table provided within a processing container, a heater that heats the substrate, a top plate having a bottom surface facing an upper surface of the placing table with a gap between the placing table and the top plate, the method comprising:
    providing a plurality of outer circumferential exhaust ports opened circumferentially along and radially within an edge portion of the bottom surface of the top plate and a central exhaust port opened in a central portion at the bottom surface of the top plate such that a center of the central exhaust port coincides with a center of the substrate placed on the placing table;
    providing a cylindrical shutter to surround the placing table and configured to block an entire circumference of the gap to form a processing space in the processing container,
    providing a gas supply port at equal intervals over an entire circumference of an inner circumferential surface of the cylindrical shutter and configured to supply gas into the processing space of the processing container, wherein the gas supply port is opened at a position lower than the substrate;
    placing the substrate on the placing table provided in the processing container, and heating the substrate;

exhausting an inside of the processing container at least from the outer circumferential exhaust port, while introducing gas from the gas supply port, into the processing space of the processing container, until a setting time point when a setting time has elapsed from a heating start time of the substrate or a setting time point when a temperature of the substrate exceeds a setting temperature; and exhausting the inside of the processing container at least from the central exhaust port, while introducing gas from the gas supply port into the processing space of the processing container, after the setting time point.

15. The method of claim 14, wherein an air flow curtain directed either from a position higher than the substrate toward a position lower than the substrate or from the position lower than the substrate toward the position higher than the substrate is formed by the exhaust of the outer circumferential exhaust port to surround the substrate.

16. The method of claim 14, wherein the exhaust is performed by the outer circumferential exhaust port and the central exhaust port at the same time at least from the heating start time of the substrate to the setting time point.

17. The method of claim 14, wherein the exhaust is performed by the outer circumferential exhaust port and the central exhaust port at the same time at least after the setting time point.

18. A non-transitory computer-readable storage medium storing therein a computer program that causes a computer to perform a method for performing a heat treatment on a substrate using a heat treatment apparatus that includes a placing table provided within a processing container, a heater that heats the substrate, a top plate having a bottom surface facing an upper surface of the placing table with a gap between the top plate and the placing table, the method comprising:

providing a plurality of outer circumferential exhaust ports opened circumferentially along and radially within an edge portion of the bottom surface of the top plate and a central exhaust port opened in a central portion at the bottom surface of the top plate such that a center of the central exhaust port coincides with a center of the substrate placed on the placing table;

providing a cylindrical shutter to surround the placing table and configured to block an entire circumference of the gap to form a processing space in the processing container;

providing a gas supply port at equal intervals over an entire circumference of an inner circumferential surface of the cylindrical shutter and configured to supply gas into the processing space of the processing container, wherein the gas supply port is opened at a position lower than the substrate;

placing the substrate on the placing table provided in the processing container, and heating the substrate;

exhausting an inside of the processing container at least from the outer circumferential exhaust port, while introducing gas from the gas supply port, into the processing space of the processing container, until a setting time point when a setting time has elapsed from a heating start time of the substrate or a setting time point when a temperature of the substrate exceeds a setting temperature; and exhausting the inside of the processing container at least from the central exhaust port, while introducing gas from the gas supply port into the processing space of the processing container, after the setting time point.

* * * * *